US006917328B2

(12) United States Patent
Rabinowitz et al.

(10) Patent No.: US 6,917,328 B2
(45) Date of Patent: Jul. 12, 2005

(54) RADIO FREQUENCY DEVICE FOR RECEIVING TV SIGNALS AND GPS SATELLITE SIGNALS AND PERFORMING POSITIONING

(75) Inventors: Matthew Rabinowitz, Portola Valley, CA (US); James J. Spilker, Jr., Woodside, CA (US)

(73) Assignee: Rosum Corporation, Redwood City, CA (US)

( * ) Notice: Subject to any disclaimer, the term of this patent is extended or adjusted under 35 U.S.C. 154(b) by 0 days.

(21) Appl. No.: 10/292,975

(22) Filed: Nov. 13, 2002

(65) Prior Publication Data

US 2003/0145328 A1 Jul. 31, 2003

Related U.S. Application Data

(60) Provisional application No. 60/361,762, filed on Mar. 4, 2002, provisional application No. 60/353,440, filed on Feb. 1, 2002, provisional application No. 60/341,922, filed on Dec. 18, 2001, and provisional application No. 60/332,504, filed on Nov. 13, 2001.

(51) Int. Cl.[7] .............................................. H04B 7/185
(52) U.S. Cl. ............................ 342/357.06; 342/357.01; 701/213
(58) Field of Search ....................... 342/357.01, 357.06, 342/357.12; 701/213, 215, 207

(56) References Cited

U.S. PATENT DOCUMENTS 5,936,571 A * 8/1999 Desjardins .................. 701/213

2002/0015439 A1 * 2/2002 Kohli et al. ................. 375/148
2002/0118133 A1 * 8/2002 Desjardins ............. 342/357.12

* cited by examiner

Primary Examiner—Dao Phan
(74) Attorney, Agent, or Firm—McDermott Will & Emery LLP

(57) ABSTRACT

An apparatus and method for determining the position of a user terminal comprise an antenna subsystem which is able to receive signals of GPS and TV, a receiver front end which converts the frequency of the incident signals and filters out unwanted signals so that the desired signals can be sampled, a digital processing component which accommodates the imperfections of the front end and converts the measured signals into a position information. The apparatus is capable of receiving at the user terminal, broadcast television signals from television signal transmitters; determining a first set of pseudo-ranges between the user terminal and the television signal transmitters based on a known component of the broadcast television signals; receiving at the user terminal global positioning signals from a global positioning satellites; determining a second set of pseudo-ranges between the user terminal and the global positioning satellites based on the global positioning signals; and determining a position of the user terminal based on the first and second sets of pseudo-ranges, locations of the television signal transmitters, and locations of the global positioning satellites.

50 Claims, 16 Drawing Sheets

RADIO FREQUENCY DEVICE FOR RECEIVING TV SIGNALS AND GPS SATELLITE SIGNALS AND PERFORMING POSITIONING

RELATED APPLICATIONS

This application claims the benefit of U.S. Provisional Patent Application Ser. No. 60/361,762, "DTV Position Location Augmented by GPS," by James J. Spilker, filed Mar. 4, 2002; U.S. Provisional Patent Application Ser. No. 60/341,922, "An Inexpensive Hardware and Signal Processing Technique for Tracking Television Signals in a Mobile Handheld Device," by Matthew Rabinowitz, filed on Dec. 18, 2001; U.S. Provisional Patent Application Ser. No. 60/353,440, "DTV Position Location Augmented by GPS," by James J. Spilker, filed Feb. 1, 2002; U.S. Provisional Patent Application Ser. No. 60/332,504 "DTV Augmented GPS for Robust Aircraft Navigation," by James J. Spilker, filed Nov. 13, 2001, the disclosures thereof are incorporated by reference herein in their entirety.

This application is related to U.S. Non-provisional Patent Application Ser. No. 10/003,128, "Robust Data Transmission Using Broadcast Digital Television Signals," by James K. Omura, James J. Spilker, Jr. and Matthew Rabinowitz, filed Nov. 14, 2001; U.S. Non-provisional Patent Application Ser. No. 09/887,158, "Position Location using Broadcast Digital Television Signals," by James J. Spilker and Matthew Rabinowitz, filed Jun. 21, 2001; U.S. Non-provisional Patent Application Ser. No. 09/932,010, "Position Location using Terrestrial Digital Video Broadcast Television Signals," by James J. Spilker and Matthew Rabinowitz, filed Aug. 17, 2001; U.S. Non-provisional Patent Applications Ser. No. 10/054,302, "Position Location using Broadcast Analog Television Signals," by James J. Spilker and Matthew Rabinowitz, filed Jan. 22, 2002; U.S. Non-provisional Patent Applications Ser. No. 10/353,669, "Position Location Using Ghost Canceling Reference Television Signals," by James J. Spilker and Matthew Rabinowitz, filed (TBS); and U.S. Non-provisional Patent Application Ser. No. 10/054,262, "Time-Gated Delay Lock Loop Tracking Of Digital Television Signals," by James J. Spilker and Matthew Rabinowitz, filed Jan. 22, 2002; U.S. patent application Ser. No. 10/159,478, "Position Location using Global Positioning Signals Augmented by Broadcast Television Signals," by Matthew Rabinowitz and James J. Spilker, filed May 31, 2002; and U.S. Non-provisional Patent Applications Ser. No. 10/290,984, "Position Location using Integrated Services Digital Broadcasting-Terrestrial (ISDB-T) Broadcast Television Signals," by James J. Spilker and Matthew Rabinowitz, filed (TBS), the disclosures thereof are incorporated by reference herein in their entirety.

INCORPORATION BY REFERENCE

This application hereby incorporates by reference in its entirety the following documents: 1) B. W. Parkinson and J. Spilker, Jr., Global Positioning System-Theory and Application, Volumes I & II, AIAA, Washington, D.C. 1996, and 2) J. Spilker, Jr., Digital Communications by Satellite, Prentice-Hall, Englewood Cliffs, N.J., 1977, 1995.

FIELD OF THE INVENTION

The present invention relates generally to position determination and data reception, specifically to a radio frequency device that enables reception of television and/or GPS signals for position determination and data reception.

BACKGROUND INFORMATION

There exist methods for two-dimensional latitude/longitude position location systems using radio signals. In use are terrestrial systems such as Loran C and Omega and satellite-based systems such as the Transit system and Global Positioning System (GPS).

Initially devised in 1974, GPS is widely used for position location, navigation, surveying, and time transfer. The GPS system is based on a constellation of 24 on-orbit satellites in sub-synchronous 12 hour circular, inclined orbits. Each satellite carries a precision atomic clocks and transmits a pseudo-noise signal, which can be precisely tracked to determine pseudo-range. By tracking 4 or more satellites, one can determine precise position in three dimensions in real time, world-wide. More details are provided in B. W. Parkinson and J. J. Spilker, Jr., Global Positioning System-Theory and Applications, Volumes I and II, AIAA, Washington, D.C. 1996.

GPS has revolutionized the technology of navigation and position location. However in some situations, the effectiveness of GPS is limited because the GPS signals are transmitted at relatively low power levels (less than 100 watts) and over great distances, the received signal strength is relatively weak (on the order of −160 dBW as received by an omni-directional antenna). Thus the signal is marginally useful or not useful at all in the presence of line-of-sight blockage or while the receiver is inside a building.

In recent years, there has been a rollout of digital television in Asia, Europe and the Americas. Some of the primary standards around the world are ATSC (e.g. United States), DVB (e.g. Europe) and ISDB (e.g. Japan). As of February 2001, approximately 1200 DTV construction permits for US DTV stations had been acted on by the FCC. Over 1600 DTV transmitters are expected in the United States. Other regions are implementing similar DTV systems. The Japan Broadcasting Corp. (NHK) has defined a terrestrial DTV signal for Japan, referred to herein as the Integrated Services Digital Broadcasting-Terrestrial (ISDB-T) signal. These new DTV signals permit multiple TV signals to be transmitted in the assigned 6 MHz radio channel. All of these different television standards employ an embedded synchronization code which is used to probe the transmission channel and mitigate the effects of multipath in a digital TV receiver. In order to be effective for channel modeling and multipath mitigation, these synchronization codes have wide bandwidths, narrow time autocorrelation functions, and high power levels. The above-stated features make the synchronization codes ideal for positioning, in particular indoors where multipath effects are severe and GPS signals may not penetrate. In addition, analog television broadcasts have also started in recent years to insert into their broadcasts a synchronization code termed the Ghost-Canceling Reference (GCR), which is used for multipath mitigation on analog signals in TV receivers that digitize the signal. Consequently, the GCR can also be used for precise ranging. Other test signals inserted in the analog broadcasts, such as the multiburst signal, may also be used for position determination.

There is a proposed system for using conventional analog National Television System Committee (NTSC) television signals to determine position. This proposal is found in a U.S. Patent entitled "Location Determination System And Method Using Television Broadcast Signals," U.S. Pat. No. 5,510,801, issued Apr. 23, 1996. However, the technique described the use of the horizontal and vertical synchronization pulses which were intended only for relatively crude synchronization of the TV set sweep circuitry, and thus will limit the level of positioning accuracy or reliability of the disclosed location technology. Further, the Federal Communication Commission (FCC) is considering decommissioning NTSC transmitters and reassigning their frequency spectrum allocations.

Additionally, there are demands to incorporate the types of services that DTV can provide within the mobile user devices. For example, efforts are underway in Korea and Japan to generate cellular handsets which include television tuners for the purpose of receiving television on mobile devices as well as conveying data using the DTV channel. Further, besides enabling High Definition Television, the new Japanese ISDB-T DTV signals are also designed for use by the mobile user, and have the ability to transmit data reliably at reduced rates to small handheld devices. Cellular phone and PDA devices will soon be released in Asia which included TV micro-tuners for the purpose of receiving data broadcast over the DTV spectrum. In a device which already includes a TV micro-tuner, there's a need for adding a TV/GPS position location capability.

SUMMARY OF THE INVENTION

The present invention relates to an apparatus and method for determining the position of a user terminal and data reception using broadcast television signals and signals from global positioning satellites (GPS).

According to one aspect of the invention, the receiver of the present invention includes an antenna system for receiving television signals and/or GPS signals, a receiver front end for converting the received signals from a first frequency or a second frequency to a third frequency, and a processing component for accepting the signals operating at the third frequency and for converting these signals into a position information.

In another aspect of the invention, the present invention is a receiver which includes a first antenna for receiving a first signal at a first frequency; a first low noise amplifier for amplifying the first signal; a second antenna for receiving a second signal at a second frequency; a second low noise amplifier for amplifying the second signal; a first frequency converter with an input and an output, the input is coupled to the first low noise amplifier for performing frequency conversion on the first signal; a switch with a first input, a second input and an output, the first switch input is coupled to the first frequency converter output, the second switch input coupled to the second low noise amplifier, and the switch is for selecting between the first signal or the second signal; a bandpass filter coupled to the switch output for filtering the first signal or the second signal; a second frequency converter coupled to the bandpass filter for converting the first signal or the second signal to a post-frequency converter signal at a third frequency; an analog-to-digital converter coupled to the second frequency converter for digitizing the post-converter signal and generating a digitized signal; and a processor coupled to the analog-to-digital converter for accepting the digitized signal and for converting the digitized signal into a position information.

In yet another aspect of the invention, the present invention is a receiver which includes an antenna system for receiving television signals and GPS signals; a low noise amplifier for amplifying the signals; an I/Q downconverter for downconverting the signals and for generating I and Q (in phase and quadrature) components for each of the signals; a first low pass filter coupled to the I/Q downconverter for filtering the I component; a second low pass filter coupled to the I/Q downconverter for filtering the Q component; a first analog-to-digital converter coupled to the first low pass filter for digitizing the I component and generating a digitized I component; a second analog-to-digital converter coupled to the second low pass filter for digitizing the Q component and generating a digitized Q component; a processing component with a first processing input and a second processing input, the first processing input coupled to the first analog-to-digital converter for accepting the digitized I component, the second processing input coupled to the second analog-to-digital converter for accepting the digitized Q component. In a preferred embodiment, the processor converts the digitized I and Q components into a position information.

In yet another aspect of the invention, the present invention is a receiver which includes an antenna system for receiving television signals and GPS signals, wherein the television signal operates at a first frequency and the GPS signal operates at a second frequency; a tunable bandpass filter having an adjustable passband; a low noise amplifier for amplifying the signals; an I/Q downconverter for downconverting the signals to a third frequency and for generating an I component and a Q component for each of the signals, wherein the I/Q downconverter comprises a first mixer, a local oscillator and a 90° phase shifter with a shifter input and a shifter output, the shifter input coupled to the local oscillator and the shifter output coupled to a second mixer; a first low pass filter for filtering the I component; a second low pass filter for filtering the Q component; a first analog-to-digital converter for digitizing the I component and generating a digitized I component; a second analog-to-digital converter for digitizing the Q component and generating a digitized Q component; and a processing component having a first processing input and a second processing input, the first processing input coupled to the first analog-to-digital converter for accepting the digitized I component, the second processing input coupled to the second analog-to-digital converter for accepting the digitized Q component, wherein the processing component converts the digitized I component and the digitized Q component into a position information.

In yet another aspect of the invention, the present invention is a method for receiving at the user terminal a plurality of broadcast television signals from television signal transmitters; determining a first set of pseudo-ranges between the user terminal and the television signal transmitters based on a known component of the broadcast television signals; receiving at the user terminal a plurality of global positioning signals from global positioning satellites; determining a second set of pseudo-ranges between the user terminal and the global positioning satellites based on the global positioning signals; and determining a position of the user terminal based on the first set and the second set of pseudo-ranges, the locations of the television signal transmitters, and the locations of the global positioning satellites. In a preferred embodiment, the method also includes adjusting the first set of pseudo ranges to a first common time instant; and adjusting the second set of pseudo ranges to a second common time instant.

In yet another aspect of the invention, the present invention is a method for receiving at the user terminal a plurality of broadcast television signals from television signal transmitters; determining a first set of pseudo-ranges between the user terminal and the television signal transmitters based on a known component of the broadcast television signals; receiving at the user terminal a plurality of global positioning signals from global positioning satellites; determining a second set of pseudo-ranges between the user terminal and the global positioning satellites based on the global positioning signals; and transmitting the first set and second set of pseudo ranges to a location server configured to determine a position of the user terminal based on the first set and second set of pseudo-ranges, locations of the television signal transmitters, and locations of the global positioning satellites. In a preferred embodiment, the method also includes adjusting the first set of pseudo ranges to a first common time instant; and adjusting the second set of pseudo ranges to a second common time instant.

In yet another aspect of the invention, the present invention is a method for receiving a first set of pseudo-ranges from the user terminal, the first set of pseudo-ranges determined between the user terminal and the television signal transmitters based on a known component of the broadcast television signals transmitted by the television signal transmitters; receiving a second set of pseudo-ranges from the user terminal, the second set of pseudo-ranges determined between the user terminal and the global positioning satellites based on the global positioning signals transmitted by the global positioning satellites; and determining a position of the user terminal based on the first set and second set of pseudo-ranges, locations of the television signal transmitters, and locations of the global positioning satellites. In a preferred embodiment, the method also includes adjusting the first set of pseudo ranges to a first common time instant; and adjusting the second set of pseudo ranges to a second common time instant.

In yet another aspect of the invention, the present invention is a method for receiving at the user terminal a plurality of broadcast television signals from television signal transmitters; determining by a location server a first set of pseudo-ranges between the user terminal and the television signal transmitters based on a known component of the broadcast television signals; receiving at the user terminal a plurality of global positioning signals from a plurality of global positioning satellites; determining by the location server a second set of pseudo-ranges between the user terminal and the global positioning satellites based on the global positioning signals; and determining by the location server a position of the user terminal based on the first set and second set of pseudo-ranges, the locations of the television signal transmitters, and the locations of the global positioning satellites.

In yet another aspect of the invention, the present invention is a method for receiving at the user terminal a plurality of broadcast television signals from television signal transmitters; determining by the user terminal a first set of pseudo-ranges between the user terminal and the television signal transmitters based on a known component of the broadcast television signals; receiving at the user terminal a plurality of global positioning signals from a plurality of global positioning satellites; determining by the user terminal a second set of pseudo-ranges between the user terminal and the global positioning satellites based on the global positioning signals; and determining by the user terminal a position of the user terminal based on the first set and second set of pseudo-ranges, the locations of the television signal transmitters, and the locations of the global positioning satellites.

The details of one or more implementations are set forth in the accompanying drawings and the description below. Other features will be apparent from the description and drawings, and from the claims.

DETAILED DESCRIPTION OF THE PREFERRED EMBODIMENT

Figure 1:
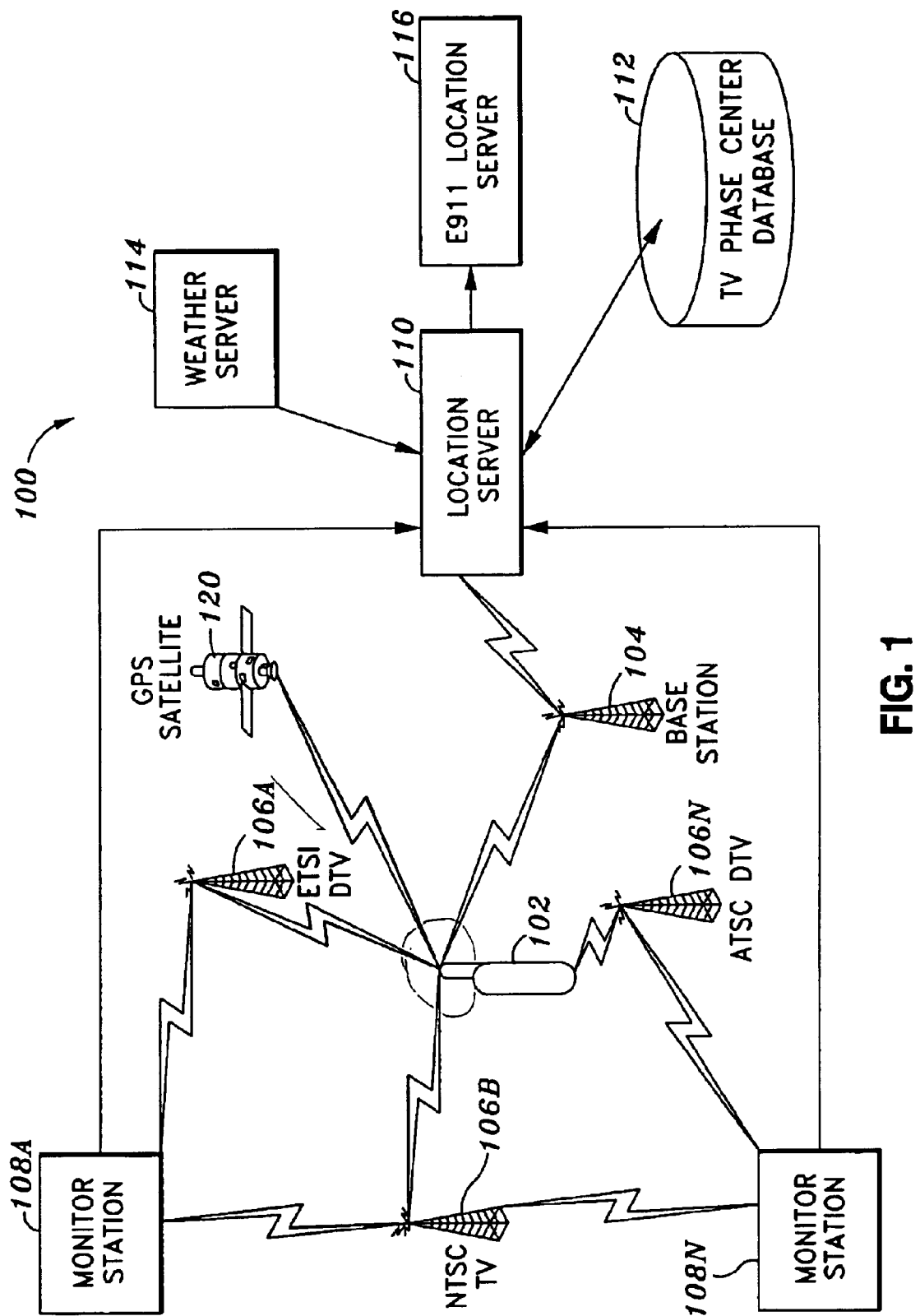
FIG. 1 depicts an implementation of the present invention including a user terminal that communicates over an air link with a base station.

FIG. 1 depicts an implementation of the present invention including a user terminal 102 that communicates over an air link with a base station 104. As described in FIG. 2, a method for position determination comprises receiving at the user terminal a first set of broadcast television signals from television signal transmitters 202; determining a first set of pseudo-ranges between the user terminal and the television signal transmitters based on a known component of the broadcast television signal 204; receiving at the user terminal a second set of global positioning signals from a set of global positioning satellites 206; determining a second set of pseudo-range between the user terminal and the global positioning satellites based on the global positioning signals 208; and determining a position of the user terminal based on the first and second set of pseudo-ranges, the locations of the set of television signal transmitters, and the locations of the set of global positioning satellites 210.

Figure 5:
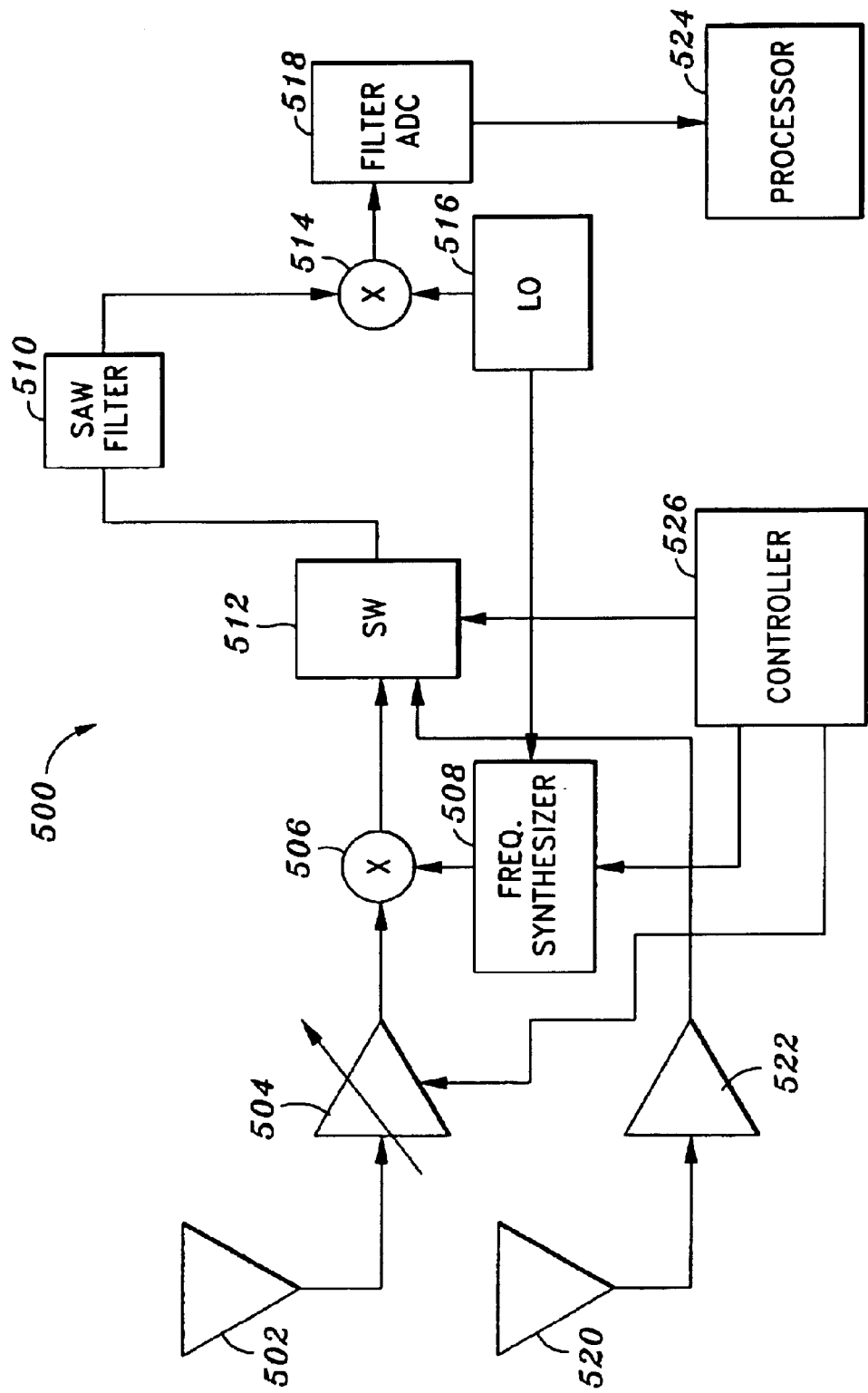
FIG. 5 is a block diagram of a receiver architecture capable of processing both television signals and GPS signals for position determination according to the present invention.

In one aspect (as shown in FIG. 5), the invention features a receiver 500 within the user terminal 102 for receiving TV and/or GPS signals in such a way that TV and/or GPS signals are used for determining the position of a user terminal. It comprises an antenna subsystem 502, 520 which is able to receive signals of GPS and/or TV, a receiver front end which converts the frequency of the incident signals and filters out unwanted signals so that the desired signals can be sampled, a digital processing component 524 which accommodates the imperfections of the front end and converts the measured signals into position information.

Figure 10:
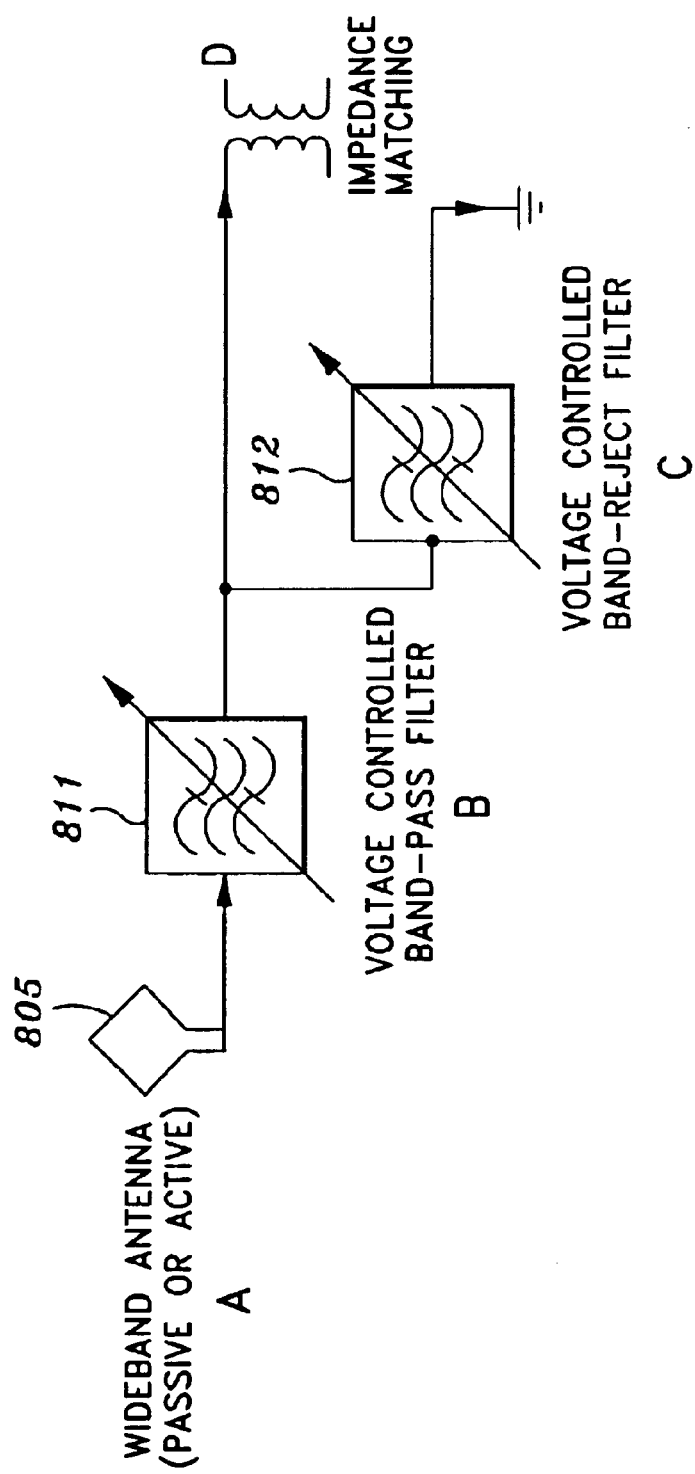
FIG. 10 is a block diagram of a circuit for coupling the antenna to the low noise amplifier, to pass the desired TV channel and to reject interfering signals in the receiver of FIG. 8.

Particular implementations of the receiver 500 can include one or more of the following features. The antenna subsystem can consist of two separate antennas 502,520, the first antenna 502 to receive the first set of TV signals, and the second antenna 520 to receive the second set of GPS signals. In another embodiment (as shown in FIG. 10), the antenna subsystem can also consist of a single antenna 805 coupled to a tunable component which can be activated or deactivated in order to cause the antenna to resonate in the TV band or GPS band respectively. Determining a position of the user terminal comprises adjusting a first set of pseudo-ranges, based on a difference between the transmitter clocks driving the broadcast television signals and a known time reference; adjusting a second set of pseudo-ranges based on the relative radial velocities between the global positioning satellites and the user terminal; and determining the position of the user terminal based on the adjusted first and second sets of pseudo-ranges, the location of the television signal transmitters, and the location of the global positioning satellites.

In one embodiment, the broadcast television signal is an American Television Standards Committee (ATSC) digital television signal, and the known component in the broadcast television signal is a known digital sequence in the ATSC frame. The known digital sequence is a synchronization code, and the synchronization code is a Field Synchronization Segment within an ATSC data frame. The synchronization code is a Synchronization Segment within a Data Segment within an ATSC data frame.

In another embodiment, the broadcast television signal is a European Telecommunications Standards Institute (ETSI) Digital Video Broadcasting-Terrestrial (DVB-T) signal. The known component in the broadcast television signal is a scattered pilot carrier.

In yet another embodiment, the broadcast television signal is a Japanese Integrated Services Digital Broadcasting-Terrestrial (ISDB-T) signal.

In yet another embodiment, the broadcast television signal is an analog television signal. The known component in the analog broadcast television signal is selected from the group comprising a horizontal blanking pulse, a ghost canceling reference signal, and a vertical interval test signal such as the multi-burst testing signal.

Broadcast television signals can be used to determine the position of a user terminal. Techniques for determining the position of a user terminal using the American Television Standards Committee (ATSC) digital television (DTV) signal are disclosed in commonly-owned copending U.S. Non-provisional Patent Application Ser. No. 09/887,158, "Position Location using Broadcast Digital Television Signals," by James J. Spilker and Matthew Rabinowitz, filed Jun. 21, 2001, the disclosure thereof is incorporated by reference herein in its entirety. Techniques for determining the position of a user terminal using the European Telecommunications Standards Institute (ETSI) Digital Video Broadcasting-Terrestrial (DVB-T) signal are disclosed in commonly-owned copending U.S. Non-provisional Patent Application Ser. No. 09/932,010, "Position Location using Terrestrial Digital Video Broadcast Television Signals," by James J. Spilker and Matthew Rabinowitz, filed Aug. 17, 2001, the disclosure thereof is incorporated by reference herein in its entirety. Techniques for determining the position of a user terminal using the Japanese Integrated Services Digital Broadcasting-Terrestrial (ISDB-T) signal are disclosed in commonly-owned copending U.S. Non-provisional Patent Applications Ser. No. 10/290,984, "Position Location using Integrated Services Digital Broadcasting-Terrestrial (ISDB-T) Broadcast Television Signals," by James J. Spilker and Matthew Rabinowitz, filed (TBS) the disclosure thereof is incorporated by reference herein in its entirety. Techniques for determining the position of a user terminal using the NTSC (National Television System Committee) analog television (TV) signal are disclosed in commonly-owned copending U.S. Non-provisional Patent Applications Ser. No. 10/054,302, "Position Location using Broadcast Analog Television Signals," by James J. Spilker and Matthew Rabinowitz, filed Jan. 22, 2002, and Ser. No. 10/159,831, "Position Location Using Ghost Canceling Reference Television Signals," by James J. Spilker and Matthew Rabinowitz, filed (TBS), the disclosures thereof are incorporated by reference herein in their entirety.

Each of the above-described television signals includes components that can be used to obtain a pseudo-range to the transmitter. When multiple pseudo-ranges, transmitter locations and transmitter clock offsets are known, the position of the user terminal can be determined accurately. Suitable components within the ATSC digital television signal include synchronization codes such as the Field Synchronization Segment within an ATSC data frame and the Segment Synchronization within a Data Segment within an ATSC data frame. Suitable components within the ETSI DVB-T and ISDB-T digital television signals include scattered pilot carriers. Suitable components within the NTSC analog television signal include: the horizontal synchronization pulse, the horizontal blanking pulse, combination of the horizontal blanking pulse and horizontal synchronization, the ghost canceling reference signal, and the vertical interval test signals such as the multiburst.

In most urban regions there are a sufficient number of TV signals broadcast from different locations to permit a user terminal to measure pseudo-ranges from 3 or more different angles to determine the position of the user terminal. However in some instances, there are blockages of one or more of the TV signals from obstacles such as hills, buildings, vehicles or even the body of a user. Likewise, the user terminal may be located in a rural region too distant from TV transmitter towers to receive the required number of TV transmitters. In cases where there are insufficient number of TV signals to generate the required number of pseudo ranges, the remaining pseudo-ranges can be supplied by using a standard global positioning system (GPS) receiver. Techniques for augmenting position location using broadcast television signals with GPS signals are disclosed in U.S. Provisional Patent Application Ser. No. 60/361,762, "DTV Position Location Augmented by GPS," by James J. Spilker, filed Mar. 4, 2002, the disclosure thereof is incorporated by reference herein in its entirety. A user terminal using these techniques can determine its position using 3 or more broadcast television signals, 3 or more GPS signals, or any combination thereof.

FIG. 1 illustrates a user terminal 102 communicating over an air link with a base station 104. In one embodiment, the user terminal 102 is a wireless telephone and the base station 104 is a wireless telephone base station. In another embodiment, the base station 104 is part of a mobile metropolitan area network("MAN") or a wide area network). ("WAN"). Additionally, the phrase "user terminal" refers to any device capable of implementing the position location techniques described herein. Examples of user terminals include PDAs, (Personal Digital Assistants), mobile phones, cars and other vehicles, and any object which could include a chip or software implementing the position location techniques described herein. Further, the term "user terminal" is not intended to be limited to units which are "terminals" or which are operated by "users."

Position Location Performed by a Location Server

Figure 2:
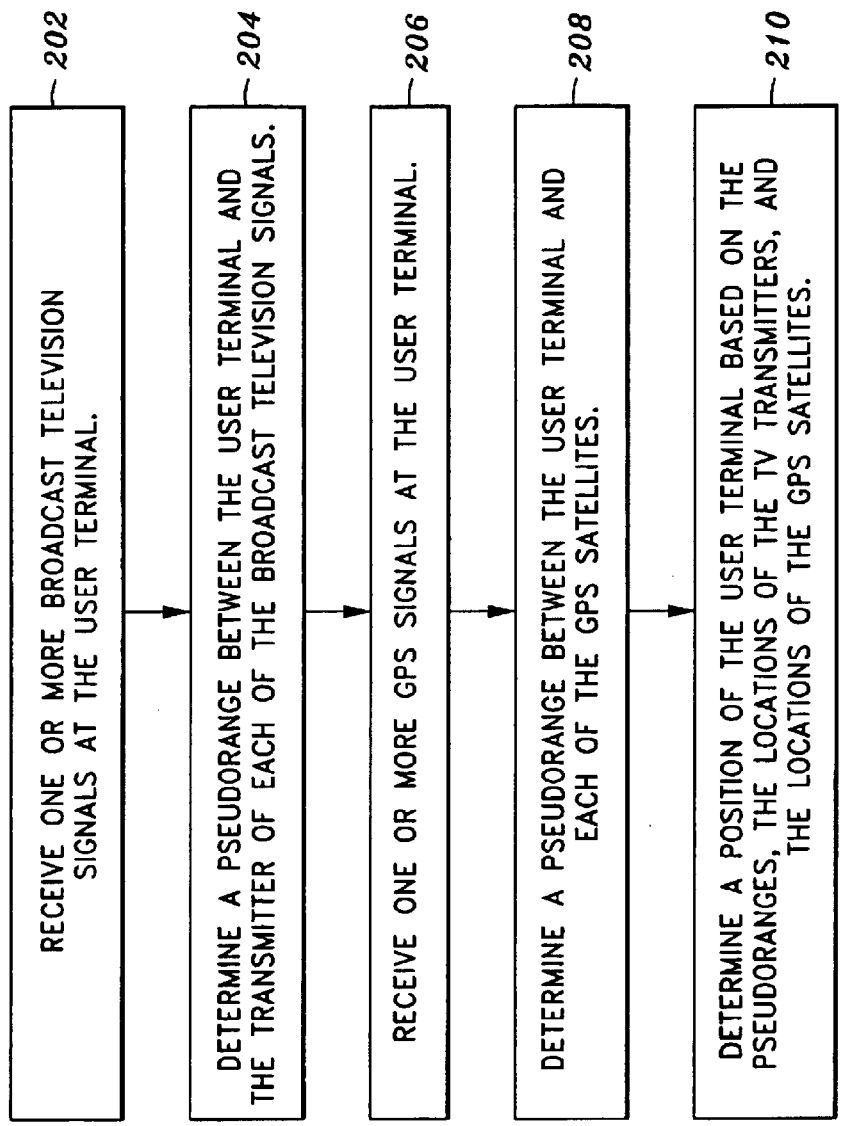
FIG. 2 is a flow diagram for implementing the present invention.

FIG. 2 is a flow diagram for implementing the present invention. User terminal 102 receives broadcast signals from one or more TV transmitters 106A and 106B through 106N (step 202). Referring to FIG. 1, as examples, TV transmitter 106A is a ETSI transmitter, TV transmitter 106B is a NTSC transmitter, and TV transmitter 106N is a ATSC transmitter. However, other combinations maybe implemented without deterring from the intent of the present invention, such as, including transmitters of the ISDB signal used in Japan, etc.

To implement step 202, there are various embodiments for selecting the TV channels to use in position location. In one embodiment, a location server 110 indicates to the user terminal 102 of the best TV channels to monitor. In another embodiment, user terminal 102 exchanges messages with location server 110 by way of a base station 104. In one embodiment, the user terminal 102 selects the TV channels to monitor based on the identity of the base station 104 and a stored table correlating base stations and TV channels. In another embodiment, user terminal 102 can accept a location input that gives a general indication of the location of the user terminal 102, such as the name of the nearest city; and uses this information to select appropriate TV channels for processing. In one embodiment, user terminal 102 scans available TV channels to assemble a fingerprint of the location based on power levels of the available TV channels. User terminal 102 compares this fingerprint to a stored table that matches known fingerprints with known locations to select TV channels for processing. This selection is based on the power levels of the DTV channels, as well as the directions from which each of the signals are arriving, so as to minimize the dilution of precision (DOP) for the position calculation.

In step 204, user terminal 102 determines a pseudo-range between the user terminal and each TV transmitter 106A–106N (not all are shown). Each pseudo-range represents the apparent time difference (or equivalent distance) between a time of transmission from a transmitter 106A–106N of a component of the TV broadcast signal and a time of reception at the user terminal 102 of the component, as well as a clock offset at the user terminal.

User terminal 102 transmits the pseudo-ranges to location server 110. In one embodiment, location server 110 is implemented as a general-purpose computer for executing software designed to perform the operations described herein. In another embodiment, location server is implemented as an application-specific integrated circuit ("ASIC"). In yet another embodiment, location server 110 is implemented within or near the base station 104.

The TV signals are also received by a plurality of monitor units 108A through 108N, as shown in FIG. 1. Each monitor unit 108A–108N can be implemented as a small unit including a transceiver and a processor. It can be mounted in a convenient location such as on a utility pole, TV transmitters 106A–106N, base station 104 or on satellites.

Each monitor unit 108A–108N measures (for each of the TV transmitters 106A–106N from which it receives TV signals) a time offset between the local clock of that TV transmitter 106A–106N and a reference clock. In one embodiment, the reference clock is derived from GPS signals. The use of a reference clock permits the determination of the time offset for each TV transmitter 106A–106N when multiple monitor units 108A–108N are used, since each monitor unit 108A–108N can determine the time offset with respect to the reference clock. Thus, offsets in the local clocks of the monitor units 108A–108N do not affect these determinations. Monitor units 108A–108N are described in detail in U.S. application Ser. Nos. 09/887,158, 09/932,010, and 10/054,302, the disclosures thereof are incorporated by reference herein in their entirety.

In another embodiment, no external time reference is needed. Accordingly, a single monitor unit 108A receives TV signals from all of the same TV transmitters 106A–106N as does user terminal 102. In effect, the local clock of the single monitor unit 108A functions as the time reference.

In another embodiment, each time offset is modeled as a fixed offset. In yet another embodiment, each time offset is modeled as a second order polynomial fit of the form:

$$\text{Offset} = a + b(t-T) + c(t-T)^2 \qquad (1)$$

that can be described by a, b, c, and T.

In the embodiments of time offsets described above, each measured time offset is transmitted periodically to the location server using the Internet, a secured modem connection, as part of the actual DTV broadcast data, or the like. In some embodiments, the location of each monitor unit 108A–108N is determined using GPS receivers.

In FIG. 1, location server 110 receives information describing the phase center (i.e., the location) of each TV transmitter 106A–106N from a database 112. In one embodiment, the phase center of each TV transmitter 106A–106N is measured by using monitor units 108A–108N at different locations to measure the phase center directly. In another embodiment, the phase center of each TV transmitter 106A–106N is measured by surveying the antenna phase center.

In one embodiment, location server 110 receives weather information describing the air temperature, atmospheric pressure, and humidity in the vicinity of user terminal 102 from a weather server 114. The weather information is available from the Internet and other sources such as NOAA. Location server 110 determines tropospheric propagation velocity from the weather information using techniques such as those disclosed in B. Parkinson and J. Spilker, Jr. Global Positioning System-Theory and Applications, AIAA, Washington, D.C., 1996, Vol. I, Chapter 17 Tropospheric Effects on GPS by J. Spilker, Jr.

Location server 110 can also receive from base station 104 information which identifies a general geographic location of user terminal 102. For example, the information can identify a cell or cell sector within which a cellular telephone is located. This information can be used for ambiguity resolution.

In step 206, user terminal 102 receives GPS signals from one or more GPS satellites 120. User terminal 102 also receives almanac data describing Doppler shifts and pseudo-noise numbers for GPS satellites 120, as described below. In step 208, user terminal 102 determines a pseudo-range between the user terminal and each GPS satellite 120. Each pseudo-range represents the time difference (or equivalent distance) between a time of transmission from a GPS satellite 120 of a component of the GPS signal and a time of reception at the user terminal 102 of the component. Clock offset at the GPS satellite 120 is also included. Next, the user terminal 102 transmits the pseudo-ranges to location server 110. In step 210, the location server 110 determines a position of the user terminal 102 based on the pseudo-ranges, locations of each of the TV transmitters 106A–106N, and locations of the GPS satellites 120.

Figure 3:
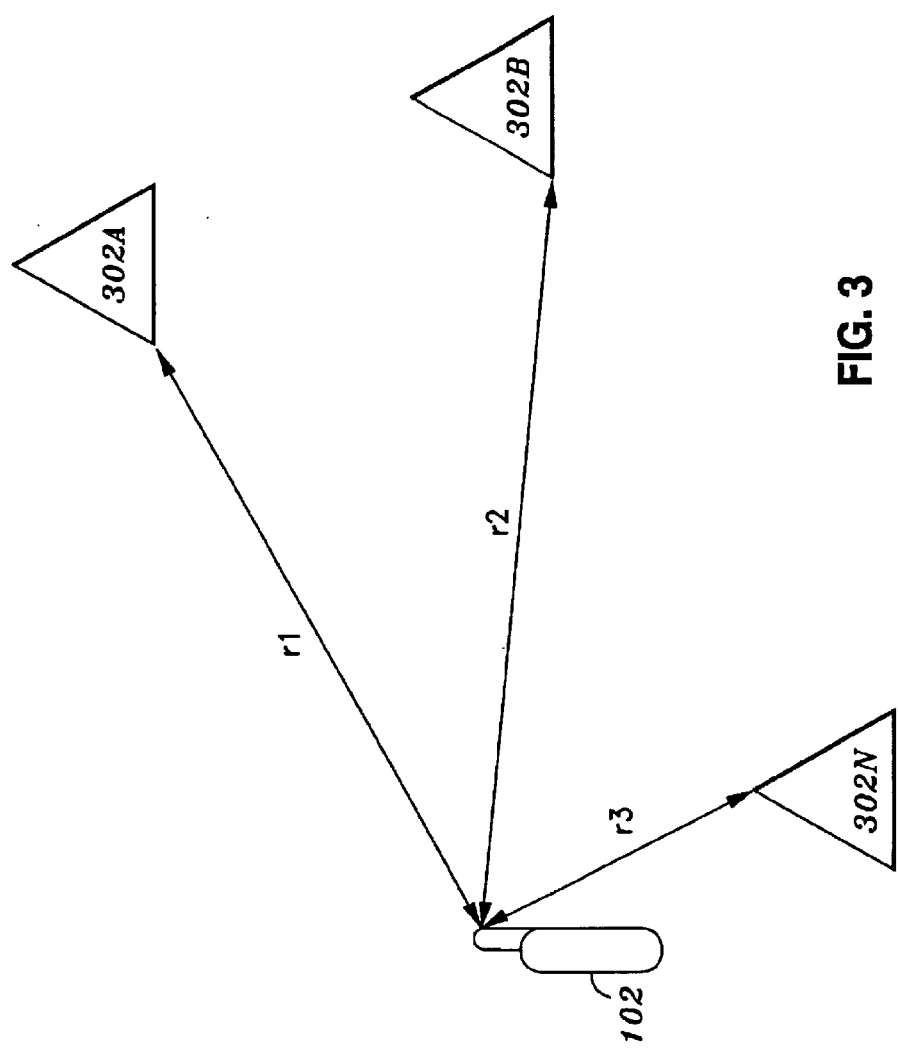
FIG. 3 depicts the geometry of a position determination using 3 DTV transmitters.

FIG. 3 depicts the geometry of a position determination using any three transmitters 302A–302N. Transmitters 302A–302N can be all TV transmitters, all GPS transmitters, or any combination thereof. For example, transmitter 302A is located at position (x1, y1, z1). The range between user terminal 102 and transmitter 302A is r1. Transmitter 302B is located at position (x2, y2, z2). The range between user terminal 102 and transmitter 302B is r2. Transmitter 302N is located at position (x3, y3, z3). The range between user terminal 102 and transmitter 302N is r3.

Location server 110 may adjust the value of each pseudo-range according to the tropospheric propagation velocity and the time offset for the corresponding transmitter 302A–302N. Location server 110 uses the phase center information from database 112 to determine the position of each transmitter 302A–302N.

In one embodiment, user terminal 102 generates at least three pseudo-range measurements to solve for three unknowns, namely the position (x, y) and clock offset T of user terminal 102. In this embodiment, it is assumed that the altitude of the user terminal is known to within the necessary degree of accuracy and only the latitude and longitude of the user terminal 102 need to be precisely determined. In another embodiment, the position of the user terminal 102 is solved in three dimensions, namely (x, y, z) which will require four or more transmitters 302A–302N. The mathematical calculation presented below is for a 2-Dimensional position fix. However, it will be clear to one skilled in the art on how to extend the techniques described herein for a 3-Dimensional position fix.

The three pseudo-range measurements pr1, pr2 and pr3 are given by $$pr1 = r1 + T \quad (2a)$$

$$pr2 = r2 + T \quad (3a)$$

$$pr3 = r3 + T \quad (4a)$$

The three ranges can be expressed as $$r1 = |X - X1| \quad (5)$$

$$r2 = |X - X2| \quad (6)$$

$$r3 = |X - X3| \quad (7)$$

where X represents the three-dimensional vector position (x, y, z) of user terminal, X1 represents the three-dimensional vector position (x1, y1, z1) of transmitter 302A, X2 represents the three-dimensional vector position (x2, y2, z2) of transmitter 302B, and X3 represents the three-dimensional vector position (x3, y3, z3) of transmitter 302N. These relationships produce three equations in which to solve for the three unknowns x, y, and T. In the embodiment where only latitude and longitude information are required, location server 110 assumes an estimate value for z and does not solve for it as part of its coordinates. In a preferred embodiment, a terrain map is used to determine the initial estimate of z which is then iteratively refined based on the computed values for x and y. In another preferred embodiment, location server 110 actively solves for z. In one application, the position location of the user terminal 102 is transmitted back to the user terminal 102. In an E911 application, the position location of the user terminal 102 is transmitted to an E911 location server 116 for distribution to the proper authorities.

In one embodiment, the clock of the user terminal 102 is stabilized or corrected using a signal from a cellular base station or a TV transmitter with a stable clock 106 or a GPS satellite. In another embodiment, the user clock is not stabilized, or corrected and a technique for projecting the measurements at the user terminal 102 to a common instant in time (common time instant) is added. Here, the user clock offset is considered to be a function of time, T(t). For a small time interval, $\Delta$, the clock offset, T(t), can be modeled by a constant and a first order term. Namely, $$T(t + \Delta) = T(t) + \frac{\partial T}{\partial t} \Delta \quad (8)$$

In this embodiment, equations 2a, 3a and 4a are treated with the clock offset as a function of time to generate equations 2b, 3b and 4b. Consequently, the pseudo range measurements are also functions of time. Note that the change in pseudo range with time will also be caused by relative motion between transmitters and receiver (and for the case of GPS satellite transmitters). The pseudo range measurements may be described as:

$$pr1(t1) = r1 + T(t1) \quad (2b)$$

$$pr2(t2) = r2 + T(t2) \quad (3b)$$

$$prN(tN) = rN + T(tN) \quad (4b)$$

In one embodiment, the user terminal 102 commences with an additional set of pseudo range measurements at some time $\Delta$ after the initial set of measurements. These additional pseudo range measurements are described below:

$$pr1(t1 + \Delta) = r1 + T(t1) + \frac{\partial T}{\partial t} \Delta \quad (2c)$$

$$pr2(t2 + \Delta) = r2 + T(t2) + \frac{\partial T}{\partial t} \Delta \quad (3c)$$

$$prN(tN + \Delta) = rN + T(tN) + \frac{\partial T}{\partial t} \Delta \quad (4c)$$

The user terminal 102 then projects all the pseudo range measurements to some common point in time (common time instant) so that the effect of the first order term is effectively eliminated. For example, if a common reference time t0 is used, applying equations (2b–4b) and (2c–4c) will project the measurements to a common instant of time as follows:

$$pr1(t0) = pr1(t1) + [pr1(t1+\Delta) - pr1(t1)](t0 - t1)/\Delta \quad (2d)$$

$$pr2(t0) = pr2(t2) + [pr2(t2+\Delta) - pr2(t2)](t0 - t2)/\Delta \quad (3d)$$

$$prN(t0) = prN(tN) + [prN(tN+\Delta) - prN(tN)](t0 - tN)/\Delta \quad (4d)$$

These projected pseudo range measurements are communicated to the location server 110 where they are used to solve for the three unknowns x, y, and T. In this calculation example, the projection in equations (2d–4d) is not precise, since the higher order terms (such as the second order term) have not been accounted for. However by ignoring the higher order terms, the complexity of the mathematical calculations have been simplified and the resulting errors from this simplification are insignificant. One skilled in the art will recognize that second order and higher terms may be accounted for by making more than two pseudo range measurements for each projection. Additionally, other approaches for implementing the concept of projecting the pseudo range measurements to the same instant of time may be used. One approach, is to implement a delay lock loop, such as those disclosed in J. J. Spilker, Jr., Digital Communications by Satellite, Prentice-Hall, Englewood Cliffs, N.J., 1977, 1995 and in B. W. Parkinson and J. J. Spilker, Jr., Global Positioning System-Theory and Application, Volume 1, AIAA, Washington, D.C. 1996, both disclosures are incorporated by reference herein in their entirety. In one embodiment, a separate tracking loop can be dedicated to each transmitter 302A–302N. These tracking loops effectively interpolate between pseudo range measurements. The state of each of these tracking loops is sampled at the same instant of time.

In another embodiment, the user terminal 102 does not compute pseudo-ranges, but rather takes measurements of intermediate signals that are sufficient to compute pseudo ranges, such as a set of correlator outputs, and transmits these measurements to location server 110. Location server 110 then computes the pseudo-ranges based on the measurements, and computes the position based on the pseudo-ranges, as described above.

Position Location Performed by User Terminal

In one embodiment, the position of user terminal 102 is computed by the user terminal 102. All of the necessary information is transmitted to user terminal 102 by location server 110, base station 104, one or more TV transmitters 106A–106N, GPS satellites 120, or any combination thereof. User terminal 102 then measures the pseudo-ranges and solves the simultaneous equations as described above.

User terminal 102 receives the time offset between the local clock of each TV transmitter 106A–106N and a reference clock. User terminal 102 also receives information describing the phase center of each TV transmitter 106A–106N from a database 112 and the tropospheric propagation velocity computed by location server 110. In one embodiment, user terminal 102 receives weather information describing the air temperature, atmospheric pressure, and humidity in the vicinity of user terminal 102 from a weather server 114, and determines tropospheric propagation velocity from the weather information using conventional techniques. User terminal 102 may also receive information which identifies the rough location of user terminal 102 from base station 104. For example, the information from base station 104 may identify a cell or cell sector within which a cellular telephone is located. This information is used for ambiguity resolution, arising from the fact that TV signals are periodic in nature.

User terminal 102 receives TV signals from one or more TV transmitters 106A–106N and determines a pseudo-range between the user terminal 102 and each TV transmitter 106A–106N. User terminal 102 receives GPS signals from one or more GPS satellites 120 and almanac data describing Doppler shifts and pseudo-noise code numbers for the GPS satellites, as described below, and determines pseudo-ranges between the user terminal 102 and the GPS satellites 120. User terminal 102 then determines its position based on the pseudo-ranges, the locations of the TV transmitters 106, and the locations of the GPS satellites 120.

The position of user terminal 102 can be determined using a TV transmitter and the offset T computed during a previous position determination for that TV transmitter. The values of T can be stored or maintained according to conventional methods.

In another embodiment, the base station 104 determines the clock offset of user terminal 102 so that only two transmitters are required for position determination. Base station 104 transmits the clock offset T to location server 110, which then determines the position of user terminal 102 from the pseudo-range computed for each of the transmitters 106A–106N.

GPS Receiver Aiding in a Hybrid TV/GPS User Terminal

Referring to FIG. 1, GPS signals are subject to large Doppler Shifts caused by the large relative radial velocities between the GPS satellites 120 (i.e., GPS satellites move rapidly in their orbits) and the stationary or slowly moving user terminals 102. These Doppler shifts can range over +/−5.5 kHz. In addition each GPS satellite 120 has a different pseudo-noise (PN) code. Thus, in order to obtain accurate pseudo range measurements with GPS signals, it is necessary to determine the Doppler shifts of the GPS satellites 120 and the PN codes.

GPS satellites 120 transmit an almanac which gives approximate satellite orbits and velocities as well as clock offsets and other factors for up to 32 GPS satellites. The entire almanac of information for the 32 GPS satellites comprises only 1 KB of information. With this 1 KB of information (knowledge of approximate satellite orbits and velocities and user terminal clock time), user terminal 102 can estimate the Doppler information for the GPS satellites 120 in view, and their corresponding PN codes to greater precision than needed for initial acquisition by a noncoherent delay lock tracking loop for GPS. In comparison, a larger frequency uncertainty is caused by the local oscillator within the user terminal 102 which may have a stability of only 5 parts per million. This frequency uncertainty by itself contributes a frequency error of approximately +/−7.9 kHz. Corrections to this error in the user terminal clock can be obtained by either tracking the TV pilot carrier or by correction using the cell phone signals.

In one embodiment, location server 110 periodically downloads to the user terminal 102 the GPS almanac data via a cell phone data link. In another embodiment, user terminal 102 computes GPS satellite Doppler from GPS satellite almanac data. Based on its approximate position (within 100 km or so), user terminal 102 can determine which GPS satellites 120 are visible at any given time. Monitor stations 108 collect the almanac data for all GPS satellites, and transfer them to user terminal 102. User terminal 102 then determines satellite visibility and Doppler. The GPS system updates the almanac data about once a week. The GPS satellite Doppler ranges from −5,500 to +5,500 Hz (at 1.575420 GHz. A typical GPS receiver only needs residual Doppler error to within 500 Hz. Provided with good user terminal position and time estimates, user terminal 102 can compute Doppler to within 1 Hz accuracy with almanac data that is a week old. Therefore, assuming that the monitor stations 108 always have the latest almanac data, monitor stations 108 need to upload fresh almanac data to user terminals 102 only once a week.

Although the official GPS constellation consists of 24 satellites, in reality there can be up to 28 satellites. Each GPS satellite 120 has a satellite ID called the satellite PN (pseudo-noise) number, which ranges from 1 through 32. The number of bits for one set of almanac data is:

Satellite ID=6 bits (to account for PRN 1–32)
Almanac=182 bits
Total=188 bits.

The entire set of almanac data for all 28 satellites needs 28×188=5,264 bits per week.

The intentional digital mobile telephony GSM standard includes protocols for transferring information to a user terminal 102 which is GSM-compatible. Specifically, GPS "assistance data" can be delivered in two ways using the GSM protocol: short message cell broadcast (SMCB) and radio resource location protocol (RRLP) messages in the control channels. SMCB can be used for almanac, ephemeris, ionospheric, and DGPS correction data. The contents of these messages are described in GSM spec 04.35, section 4.2. These messages many be available to battery pack accessories on some user terminals, since the protocol is based on a form of SMS.

RRLP messages can include everything a SMCB message includes, but can also add "acquisition assistance" information, which includes code offsets and Doppler data. These messages are described in GSM spec 04.32, annex A.4.2.4 and are generally not available to a battery pack accessory.

In one embodiment, monitor station 108A–108N upload satellite Doppler to user terminals 102. Monitor stations 108A–108N keep the almanac data and compute GPS satellite visibility and Doppler estimates. In another embodiment, monitor stations 108A–108N use their own location (instead of the user terminal location, which neither the monitor station nor the user terminal 102 knows at the time) in the estimation. One Hertz resolution of the Doppler is adequate (considering the uncertainty due to the local oscillator in the user terminal 102). Furthermore, the maximum number of Doppler sets is the number of visible satellites, not the number of satellites in constellation. The number of bits required for every contact is:

Satellite ID=6 bits (to account for PRN 1–32)
Doppler=14 bits (to account for +/=5,500 Hz in 1-Hz resolution)
Total=20 bits.

Assuming a maximum of 12 visible satellites; 12*20=240 bits per contact.

Receiver Signal Processing Architecture

Figure 4:
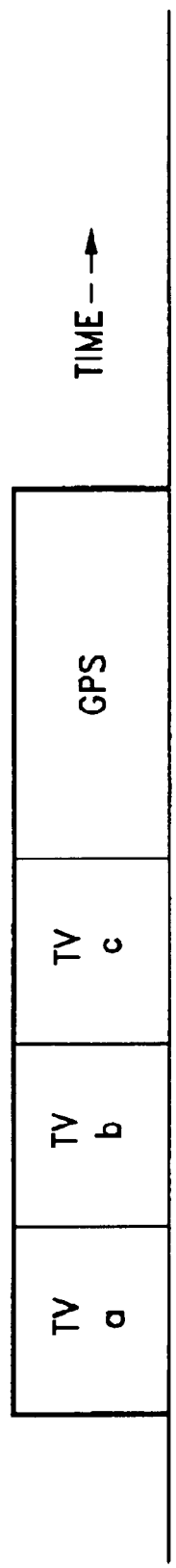
FIG. 4 illustrates a time switching sequence for an integrated TV/GPS receiver according to one embodiment of the present invention.

FIG. 4 shows a time switching sequence for an integrated TV/GPS receiver according to the present invention. The receiver sequences in time over the various signal sources by serially changing the TV channel frequencies to examine three TV signals (TVa, TVb, and TVc) in this example and then switching to the GPS band to examine one or more GPS signals. When tuned to the GPS band, the receiver can correlate any of the multiple GPS satellites in view concurrently.

The signal processing for both TV and GPS signals can be performed either using correlation of short samples of the received digitized signals or by using a delay-lock loop or time-gated delay lock loop. Such delay lock loop techniques are disclosed in commonly-owned copending U.S. Non-provisional Patent Application Ser. No. 10/054,262, "Time-Gated Delay Lock Loop Tracking Of Digital Television Signals," by James J. Spilker and Matthew Rabinowitz, filed Jan. 22, 2002, the disclosure thereof incorporated by reference herein in its entirety.

FIG. 5 is a block diagram of a receiver 500 for processing both television signals and GPS signals for position determination. Receiver 500 includes an antenna system 501 (not identified as such) for receiving TV signals and GPS signals. In one embodiment, antenna system 501 includes antenna 502 which is a single feed antenna coupled to a tuning circuit 503 (not shown) to resonate at the different frequencies of the television signals or the GPS signals. In another embodiment, antenna system 501 includes first antenna 502 and second antenna 520 (i.e., two feeds as shown in FIG. 5), for outputting a signal in the TV band and for outputting a signal in the GPS band. In one embodiment, a switch 505 (not shown) determines which antenna 502, 520 outputs to the receiver front end 550 at any given time. The receiver front end 550 (not identified as such) includes all the components shown in FIG 5 except the antenna system 501 and the processor 524. A low noise amplifier/RF filter unit 504 amplifies and filters the received TV signals from antenna 502. The RF filter portion of unit 504 is tunable over the required range for the set of TV channels that is selected. As an example, the frequency range may be the UHF channels in the frequency range of 450 MHz through 850 MHz. In one embodiment, the low noise amplifier portion of unit 504 includes an automatic gain control function. A first frequency converter 505 (not identified as such) includes a mixer 506, and a frequency synthesizer 508 to serve as a local oscillator. The mixer 506 combines the filtered TV signal from the LNA/RF Filter 504 with the output of a frequency synthesizer 508 to up-convert the TV signal to an IF frequency where a narrow bandwidth SAW filter 510 can be employed. The frequency synthesizer is driven by a local oscillator. In a preferred embodiment, the IF frequency is at or near to the GPS L1 frequency of 1575.42 MHz which allows compatibility with GPS signals. In another embodiment, the IF frequency is at or near to the GPS L2 frequency of 1227.6 MHz. In yet another embodiment, the IF frequency is at or near to the new GPS L5 signal which is in the 1.1 GHz region. It will be known to one skilled in the art that other IF frequencies and front end architectures may be used for amplifying, filtering and downconverting the incoming signals. Once the conversion to an IF frequency is completed, a switch 512 then passes the TV or GPS signal to a SAW filter 510.

In one embodiment, a second frequency converter 513 (not indicated as such) includes a mixer 514 and a local oscillator 516. The mixer 514 combines the TV or GPS signal from the SAW filter with the output of the local oscillator 516 to down-convert the TV or GPS signal to a post-second-frequency converter signal at a convenient IF frequency. In one embodiment, the convenient IF frequency is 44 MHz, a standard TV IF frequency. Filter/ADC 518 then filters and digitizes the post-second-frequency converter signal to generate a digitized signal. In a preferred embodiment, the post-second-frequency converter signal is IF sampled at 27 Msps (Mega samples per second) using a 10 bit ADC. The digitized signal is then fed to a processing component 524 for digital signal processing. In one embodiment a controller 526 controls the LNA/RF filter unit 504, the frequency synthesizer 508, and the switch 512.

The GPS antenna 520 receives the GPS signals. In one example, the GPS antenna 520 is a patch antenna known to one skilled in the art. A low noise amplifier and RF filter 522 amplifies and filters the received GPS signals. Switch 512 passes the GPS signal to the SAW filter 510. Mixer 514 combines the filtered GPS signal with the output of a local oscillator 516 to down-convert the filtered GPS signal to a convenient IF or baseband frequency. Filter/ADC 518 then filters and digitizes the GPS signal. The GPS signal is IF sampled. In one embodiment, the GPS signal is IF sampled at 27 Msps (Mega samples per second) using a 10 bit ADC. GPS signals can be sampled at substantially lower sampling rates and with fewer bits without significantly affecting performance. Considering the design of the system, an appropriate sample rate will be clear to one skilled to the art. The digitized GPS signal is fed into a processing component 524 for digital signal processing. In accordance with the knowledge of one skilled in the art, it is clear that the processing component 524 may be a processor, a MicroProcessor, a DSP or may be implemented largely in hardware.

In one embodiment, the receiver front end 550 is fabricated as a single integrated circuit, with the exception of the SAW filter 510 (or similar high selectivity bandpass filter) and the processing component 524 which are fabricated as separate integrated circuits.

Figure 6:
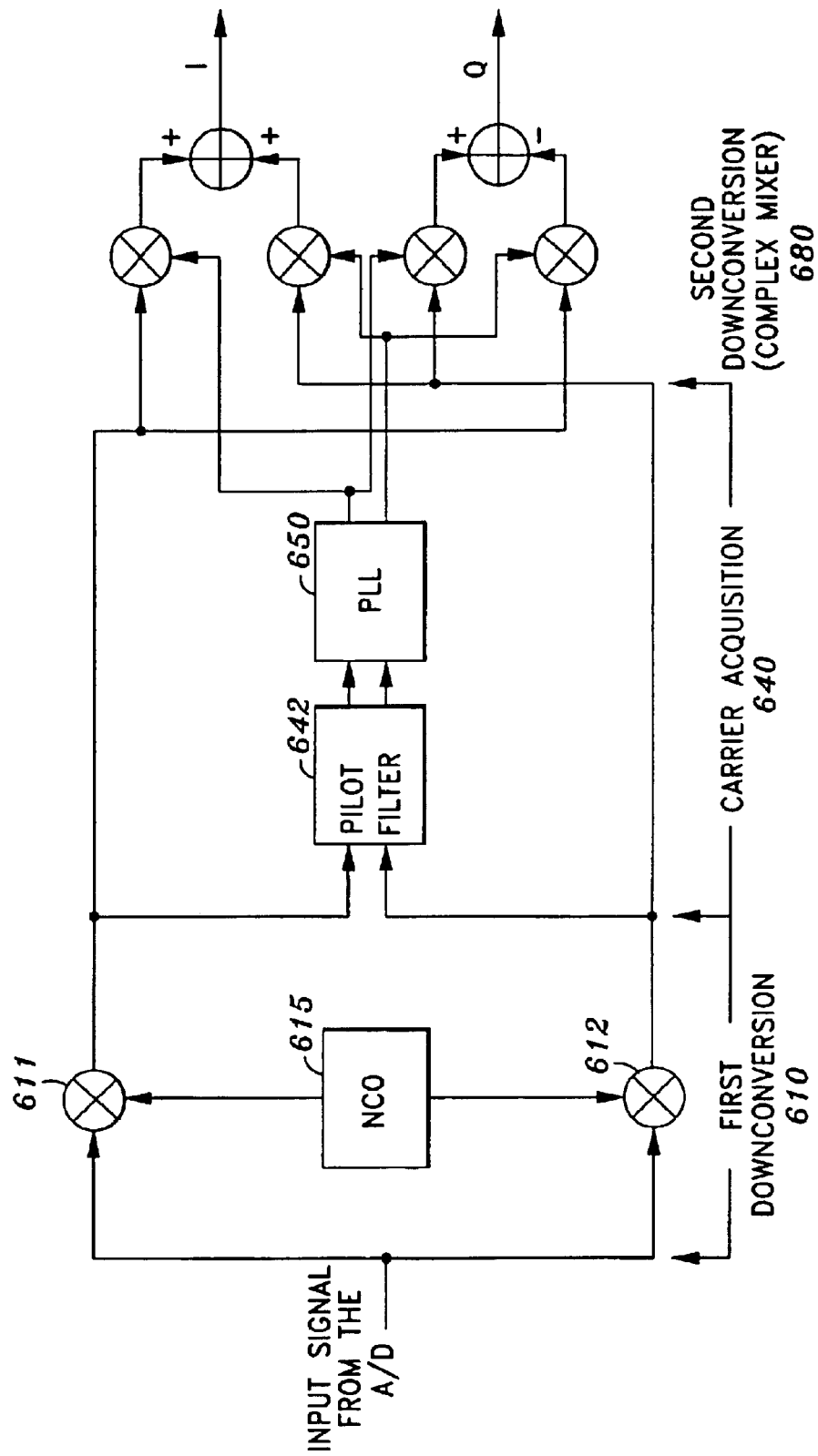
FIG. 6 is a block diagram of a coherent digital downconverter in accordance with the present invention.

In a preferred embodiment, processing component 524 includes a digital downconverter 600. FIG. 6 is a block diagram of coherent digital downconverter 600 which takes the real valued digitized signal (a.k.a. input signal) from the output of the ADC 518, and generates a complex valued digital baseband signal (in I and Q form). In one embodiment, the second IF signal (a.k.a. post second-frequency-converter signal) at the input to the ADC 518 has a spectrum that lies between [41, 47] MHz, which after undersampling at 27 MHz by the ADC 518 is translated (via aliasing) to [7, 13] MHz band. There is also a reversal of the spectrum (due to aliasing onto negative baseband frequencies) so that the pilot signal is at the lower end of the spectrum, in the vicinity of 7 MHz. Due to the large offsets of the pilot frequency between various analog and digital channels, the coherent digital downconverter 600 needs frequency aiding; i.e., an external algorithm supplies an estimate of the pilot frequency to the coherent digital downconverter 600, accurate enough for it to lie within the tracking range of the PLL.

The coherent digital downconverter 600 includes a first downconversion unit 610, a carrier acquisition unit 640 and a second downconversion unit 680. In the coherent digital downconverter 600, the downconversion process is achieved in two stages. The first stage (utilizing the first downconversion unit 610 and the carrier acquisition unit 640) consists of mixing the real-valued input signal with quadrature outputs of a first Numerically Controlled Oscillator 615 (NCO), whose frequency is adjusted to be 700 kHz below the estimated pilot frequency. The spectrum of the input signal is translated such that the pilot signal is at 700 kHz. The downconversion to 700 kHz prior to recovering the carrier signal enables a single, fixed coefficient filter to extract the pilot signal. The pilot frequency output from the ADC 518 varies over a range of several hundred kHz as tuning is varied through different TV channels. Hence, it is necessary to bring it down to a fixed value by correctly setting the frequency of the first downconversion. The correct setting of the frequency of the first downconversion is known to one skilled in the art.

Figure 7:
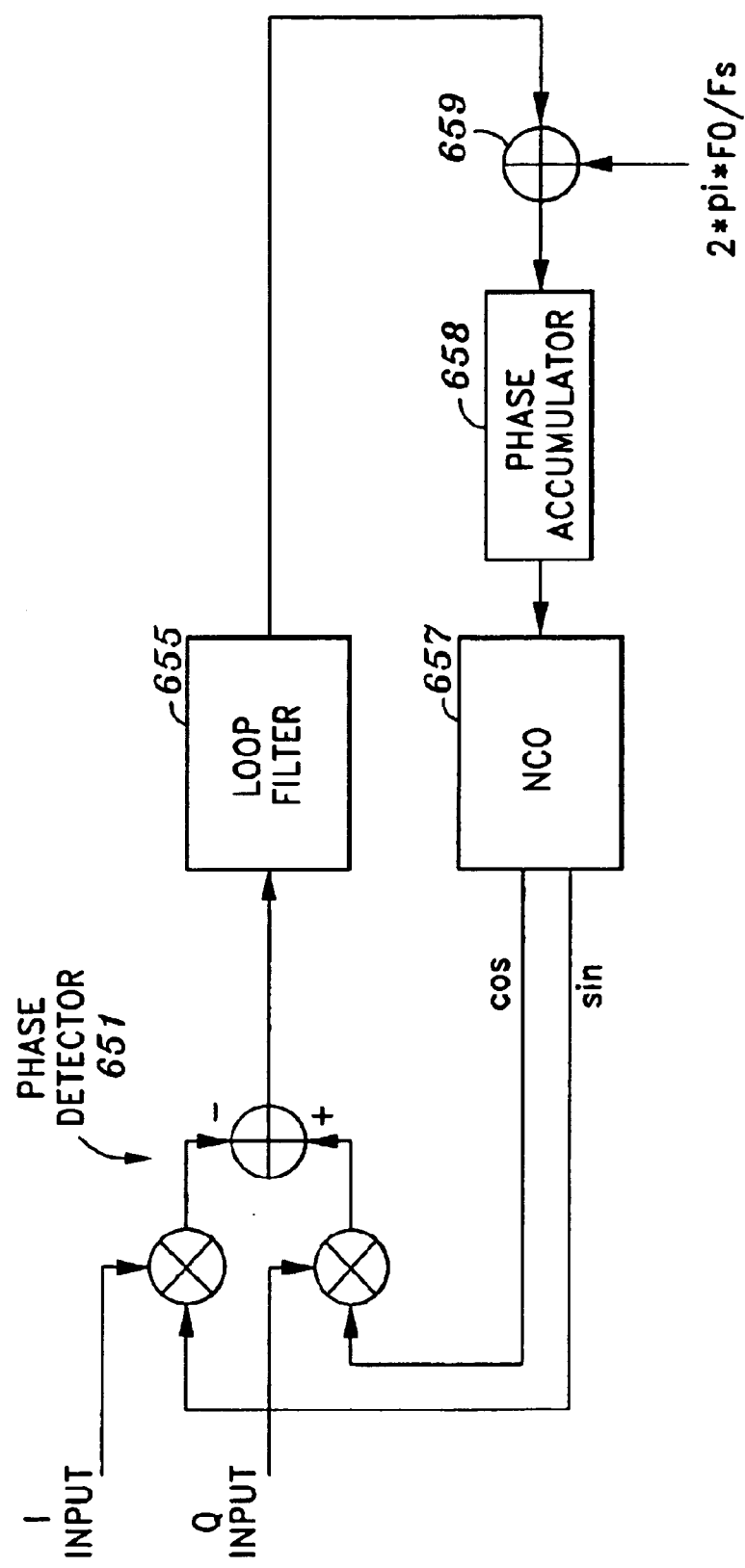
FIG. 7 is a block diagram for implementing a phase-locked loop to acquire the incident carrier signal.

After the first downconversion, the input signal is branched into 2 paths, namely through the carrier acquisition unit 640 and second downconversion unit 680. Carrier acquisition unit 640 (a.k.a. carrier recovery) consists of a narrow bandpass filter 642 and a phase-locked loop (PLL) 650 whose details are illustrated in FIG. 7. The purpose of the PLL 650 is to reproduce the vestigial sideband (VSB) carrier with the help of the pilot signal present in the input signal. The PLL 650 includes a phase detector 651, loop filter 655 and a second NCO 657. In one embodiment, the second NCO 657 is programmed to generate a 700 kHz signal. The phase detector 651 is a complex mixer which multiplies the I/Q outputs of the filtered pilot signal with I/Q outputs of the second NCO 657. The resulting signal from the mixing is passed through a loop filter 655, which is implemented in one embodiment as a second order Infinite Impulse Response (IIR) Filter. The coefficients of the loop filter 655 are chosen to satisfy closed loop stability, desired tracking range and acceptable phase noise of the second NCO 657. The output of the loop filter 655 is then scaled by a constant by multiplier 659. The output of multiplier 659 is sent to a phase accumulator 658 which determines the rate of the second 657. The phase accumulator 658 maintains a running tally of the sum of the individual samples of the output of the multiplier 659. The output of the phase accumulator 658 drives the second NCO 657 to maintain lock in the filtered pilot signal.

The second downconversion unit 680 consists of a complex mixers which mix the I-Q outputs of the first stage of downconversion with the I-Q outputs of the PLL. The output signal of the coherent digital downconverter 600 is a complex baseband signal and, in one embodiment, has a spectrum in the range [0, 6] MHz.

In another embodiment for downconversion, the TV signal output from the SAW filter 510 is directly converted to a baseband frequency (instead of to an IF frequency) with an in-phase and quadrature mixer used in placed of the single mixer 514. Many other alternative techniques (known to one skilled in the art) exist to implement the signal processing required for the present invention and will not change the fundamental idea of the present invention.

Figure 8:
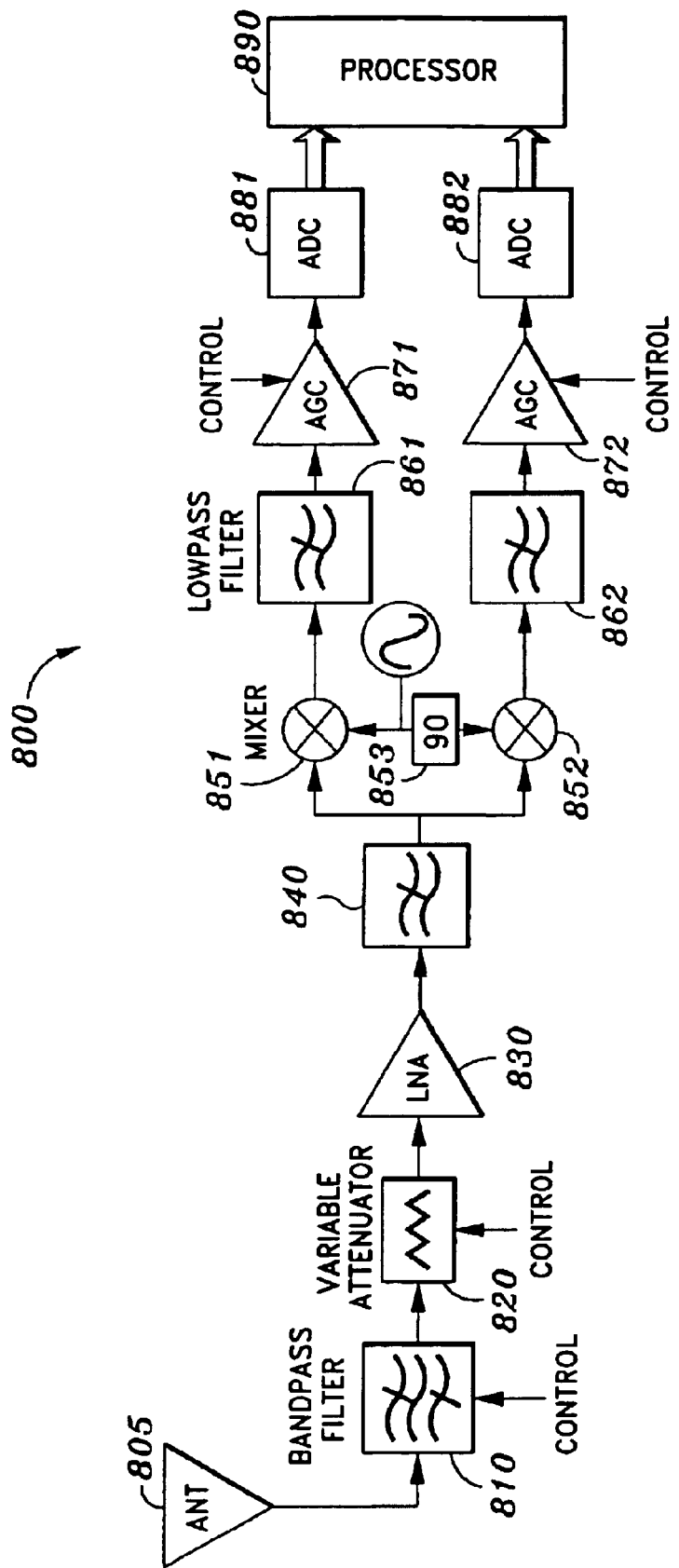
FIG. 8 is a block diagram of a second embodiment of a receiver architecture in accordance to the present invention.

FIG. 8 is a second embodiment of a receiver architecture in accordance with the present invention. The receiver 800 includes antenna 805, bandpass filter 810, low noise amplifier (LNA) 830, low pass filters 840, 861, 862, mixers 851, 852, automatic gain control (AGC) 871, 872, Analog-to-Digital Converter (ADC) 881, 882 and a processing component 890. Optionally, the receiver 800 may include a variable attenuator 820, local oscillator (LO) 854 and/or a phase shifter 853. The architecture of the receiver 800 is well-suited for integrating into an Application Specific Integrated Circuit (ASIC). The tunable bandpass filter 810 removes unwanted interference signals so that the LNA 830 is not saturated, and inter-modulation products do not disrupt system performance. The tunable bandpass filter 810 has an adjustable passband which can be adjusted to select an instantaneous desired frequency band. In one embodiment, the attenuator 820 is added at the front end (as shown in FIG. 8) to improve the dynamic range of the receiver 800, by attenuating signal power levels when the mobile device is close to a TV transmitter and receiving a very powerful signal. The LNA 830 amplifies the signal. The signal is then passed to an I/Q downconverter 850 (not indicated) which includes mixers 851, 852, a 90° phase shifter 853 and a local oscillator 854. Receiver 800 allows for direct downconversion of the received TV signal to a baseband frequency. The mathematics associated with the downconversion is analyzed below. The output of the I/Q downconverter 850 is an I component of the received signal and a Q component of the received signal. The LO signal from the LO 854 (which drives the mixers 851, 852 and the 90° phase shifter 853) converts the signal down to baseband, or a very low Intermediate Frequency (IF) so that it can be filtered with low-pass filters 861, 862 that can be implemented on an Integrated Circuit (IC). The Automatic Gain Control (AGC) 871, 872 adjusts the magnitude of the signal so as to improve use of the available bits of the Analog to Digital Converter (ADC) 881, 882. The outputs of the ADCs 881, 882 are digitized I components and digitized Q components. In this embodiment, the outputs of the ADC 881, 882 are inputs to the processing component 890. In accordance with the knowledge of one skilled in the art, it is clear that the processing component 890 may be a processor, a MicroProcessor, a DSP or may be implemented largely in hardware. The architecture of the receiver 800, as described above, differs from conventional receivers for downconverting TV signals for two reasons: first, receiver 800 does not require the use of an off-chip Surface Accoustic Wave (SAW) SAW filter; and second, the receiver 800 is designed to receive only Ultra-High Frequency (UHF) DTV channels, so that the full tuning range can be covered by a single LO 854. In another embodiment, additional direct downconversion paths can be added to receive VHF signals.

The mathematical analysis of the downconversion of TV signals in receiver 800 is presented below. The signal incident at the first mixer stage with in-phase and quadrature components is represented mathematically as follows:

$$s(t)=c_i(t)\cos(\omega_0 t+\phi)-C_q(t)\sin(\omega_0 t+\phi)$$

where $c_i$ and $c_q$ represent only the useful synchronization signal. Here, the data signal is considered as interference and is ignored. The signal is mixed with in-phase reference signal $m_1(t)=\cos(\omega_1 t+\delta t)$ and filtered by the low-pass filter 861 to produce $$s_1(t) = \frac{c_i(t)}{2}\cos(\Delta\omega t + \delta t - \phi) + \frac{c_q(t)}{2}\sin(\Delta\omega t + \delta t - \phi)$$

where $\Delta\omega=\omega_1-\omega_0$ and $\delta$ is the frequency error in generating the reference signal. In one embodiment, $\Delta\omega$ may is roughly 3 MHz for a 6 MHz VSB (Vestigial Sideband) signal. In this way, a lowpass filter with a single-sided bandwidth of only 3 MHz can be used to filter a 6 MHz channel. Similarly, the signal is mixed with quadrature reference signal $m_2(t)=\sin(\omega_1 t+\delta t+\alpha)$ and filtered by the low-pass filter 862 to produce $$s_2(t) \approx \frac{c_i(t)}{2}\sin(\Delta\omega t + \delta t - \phi) - \frac{c_q(t)}{2}\cos(\Delta\omega t + \delta t - \phi) + \frac{\alpha}{2}c_i(t)$$

where $\alpha$ arises since the "quadrature" reference signal is an analog signal and is not exactly 90 degrees offset in phase relative to the in-phase reference signal. The in-phase and quadrature signals are then respectively amplified by the AGC amplifiers 871, 872 and sampled by the in-phase and quadrature ADCs 881, 882.

In an alternative embodiment, a single analog to digital converter with a switch to sample in-phase and quadrature channels is used in place of ADCs 881, 882. Although the signal is digitized, the analog notation is used (during this mathematical calculation) for simplicity. (In another embodiment, frequency and phase lock on the sign established with an analog mixer.) The digitized version of $s_1(t)$ is mixed with $m_3(t)=\cos(\Delta\omega t+\gamma t+\theta)$ to produce $$s_3(t) = \frac{c_i(t)}{4}\{\cos(2\Delta\omega t + \delta t + \gamma t + \theta - \phi) + \cos(\delta t - \gamma t - \theta - \phi)\} + \frac{c_q(t)}{4}\{\sin(2\Delta\omega t + \delta t + \gamma t + \theta - \phi) + \sin(\delta t - \gamma t - \theta - \phi)\}$$

where $\gamma$ and $\theta$ are respectively the frequency and phase offset in the reference signal $m_3(t)$. Similarly, the digitized version of $s_2(t)$ is then mixed with $m_4(t)=\sin(\Delta\omega t+\gamma t+\theta)$ to produce $$s_4(t) = \frac{c_i(t)}{4}\{\cos(2\Delta\omega t + \delta t + \gamma t + \theta - \phi) + \cos(\delta t - \gamma t - \theta - \phi)\} + \frac{c_q(t)}{4}\{\sin(2\Delta\omega t + \delta t + \gamma t + \theta - \phi) + \sin(\delta t - \gamma t - \phi - \theta)\} + \frac{\alpha}{2}s_3(t)$$

Mathematically, when combine the in-phase and quadrature signals are combined, it generates the downconverted sampled signal $s_{samp}(t)=s_3(t)+s_4(t)=$ $$\frac{c_i(t)}{2}\cos(\delta t - \gamma t - \phi - \theta) + \frac{c_q(t)}{2}\sin(\delta t - \gamma t - \phi - \theta) + \frac{\alpha}{2}s_3(t).$$

The degree of rejection of the unwanted component $$\frac{\alpha}{2}s_3(t)$$

is determined by the magnitude of $\alpha$, or the precision with which the 90 degree analog phase lag can be implemented. It is expected that $\alpha \leq 3°$ which will result in roughly 25 dB of rejection of $s_3(t)$. While this disturbance signal would have a detrimental effect on the reception of digital television, it does not significantly affect the navigation receiver performance due to the processing gain of the correlation processing. Consequently, this term can be treated as negligible and is ignored in subsequent discussion.

Different approaches may be used for correlating the downconverted signal and extracting timing information in processor 890. One approach for mitigating the effects of multipath is to sample an entire autocorrelation function. (A conventional approach is to use only early and late samples in a standard DLL (Delay-locked loop) implemented in hardware.) Multipath effects can be mitigated by selecting the earliest correlation peak. In the case that location position can be computed with a brief delay, an approach is to use a software receiver which samples a sequence of the down-converted signal, and then processes the sample in firmware on a digital signal processor (DSP).

In one embodiment, correlation processing may be performed with a non-coherent software receiver which that does not require an incident pilot signal. Below is a description of correlation processing with a non-coherent software receiver. A nominal offset frequency for the downconverted sampled signal is assumed. If the TV signal is downconverted directly to baseband as with receiver 800 discussed above, the nominal offset is 0 Hz. The processor (e.g., processing unit 524 or processor 890) generates the complete autocorrelation function based on sampled signal $s_{samp}(t)$.

In the correlation processing, let $T_i$ equal the period of data sampled, $\omega_{in}$ equal the nominal offset of the sampled incident signal, and $\omega_{offset}$ equal the largest possible offset frequency due to Doppler shift and oscillator frequency drift. The correlation processing implements the pseudocode listed below. $R(\tau)$ is the correlation function with time offset $\tau$. $R_{max}$ is the maximum of the absolute value of $R(\tau)$.
Initially set —$R_{max}=0$
Create a complex code signal $$s_{code}(t)=C_i(t)+jC_q(t)$$

where $C_i$ is the function describing the in-phase baseband signal and $C_q$ is the function describing the quadrature baseband signal.
Compute $F(s_{code})^*$ where F is the Fourier transform operator, and * is the conjugate operator.
For $\omega=\omega_{in}-\omega_{offset}$ to $\omega_{in}+\omega_{offset}$ step $$\frac{\pi}{2T_i}$$

Create a complex mixing signal $$s_{mix}(t) = \cos(\omega t) + j\sin(\omega t), t = [0 \ldots T_i]$$

Combine the incident signal s(t) and the mixing signal $s_{max}(t)$ $s_{comb}(t)=s_{samp}(t)s_{mix}(t)$
Compute the correlation function $R(\tau)=F^{-1}\{F(s_{code})*F(s_{comb})\}$ $$R(\tau) = F^{-1}\{F(s_{code})^* F(s_{comb})\}$$

If $\max_r |R(\tau)| > R_{max}$, $R_{max} \leftarrow \max_r |R(\tau)|$, $R_{store}(\tau) = R(\tau)$ Next $\omega$ Upon exit from the process, $R_{store}(\tau)$ will store the correlation between the incident sampled signal $s_{samp}(t)$ and the complex code signal $s_{code}(t)$. $R_{store}(\tau)$ may be further refined by searching over smaller steps of $\omega$. The initial step size for $\omega$ must be less then half the Nyquist rate $$\frac{2\pi}{T_i}.$$

The time offset $\tau$ that yields the maximum correlation output is used as the pseudo-range. Although it is not described in detail here since it is known to one skilled in the art, other processing techniques, such as, but not limited to, using a low duty factor reference signal, may be used.

Figure 9:
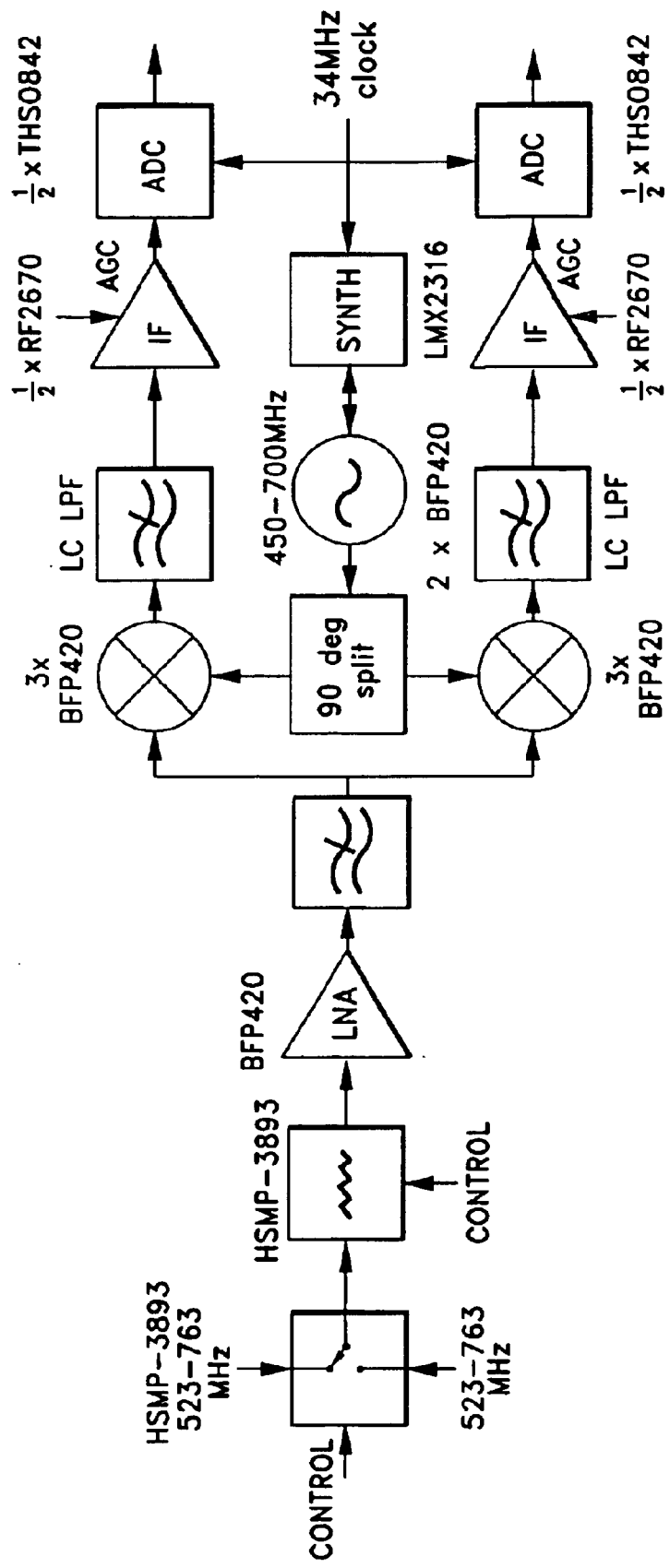
FIG. 9 illustrates off-the-shelf circuit components which can be combined to implement the direct downconversion receiver architecture of FIG. 8.

FIG. 9 illustrates some off-the-shelf parts which may be used to implement the front end of the direct downconversion receiver 800. In FIG. 9 a diversity antenna with multiple elements which can be switched in and out, depending on the measured post-correlation signal strength is used. The diversity antenna need not be implemented as a switch between multiple antennas, but may also be implemented by varying the voltage that drives a tuning circuit which couples to the antenna. As an example, listed below are off-the-shelf components which may be used for the architecture of receiver 800. It is clear to one skilled in the art that substitutions of other off-the-shelf components may be used without altering the scope and functionality of the present invention.

| Component | Quantity | Part Number |
|---|---|---|
| LNA | 1 | BFP420 |
| switch | 2 | HSMP-3893 |
| mixer | 2 | BFP420 |
| baseband | 1 | RF2670 |
| ADC | 1 | THS0842 |
| synth | 1 | LMX2316 |
| VCO | 1 | BFP420 |
| varactor | 1 | MA4ST083 |

Figure 11:
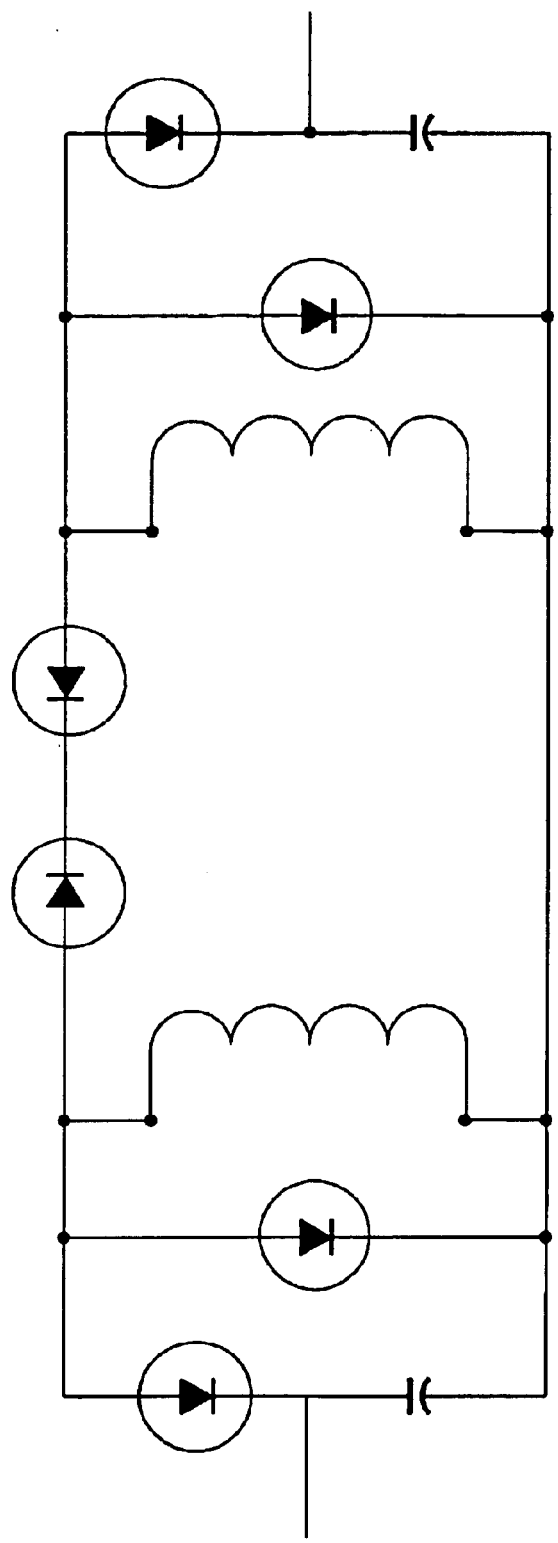
FIG. 11 illustrates the components of the voltage controlled tuning filter of FIG. 10.

Receiver 800 (shown in FIG. 8) is tunable. One of its functionalities is the ability to selectively pass and reject portions of the broadcast television spectrum. This tunability is achieved through the tunable bandpass filter 810. FIG. 10 illustrates a tunable bandpass filter circuit for coupling the antenna to the low noise amplifier, which passes the desired TV channel and rejects interfering signals in receiver 800. The tunable bandpass filter 810 must enable rapid and stable frequency selection such that the receiver front-end may be controlled to operate in a 'frequency hopping' manner. In sequential operation, the TV channels are selected for analysis, the filters are tuned, analysis is performed and the filters are re-tuned until all TV channels of interest have been analyzed. Hence, the settling time of the bandpass filter 810 (and all tuning components) must be rapid. It is known to one skilled in the art that various architectures of the bandpass filter 810 may be implemented without changing the fundamental concept. An embodiment of the bandpass filter 810 architecture is described in FIG. 10 which makes use of two sections of voltage tunable filters (a voltage controlled bandpass filter 811 and a voltage controlled bandreject filter 812) to pass the selected TV channel signal and remove unwanted interference. In one embodiment, the tunable section is implemented as described in FIG. 11 with the use of a set of inductors and variactors, the capacitance of which is varied by changing the input voltage signals. The tunable range of frequencies is determined by the magnitude of the inductances and the range of capacitance values of the tunable variactors which will be clear to one skilled in the art. In one embodiment where use is made of UHF TV signals, the range of tunable frequencies is from 450 MHz to 850 MHz. However, receiver 800 may be optionally designed to operate over alternate frequency spectra, not necessarily containing Broadcast Television stations, by altering the range of tunable frequencies.

In a preferred embodiment, the frequency of interest is initially selected by a predetermined algorithm. The voltage controlled filters 811, 812 are tuned by voltages applied by external control circuitry. The voltages are also selected algorithmically, potentially as a simple look-up table. Once a short period of time (the settling time) has passed, the voltage controlled filters 811, 812 are assumed to be tuned and on-frequency. TV Signals pass through the tunable voltage controlled band-pass filter 811 which provides signal selectivity. Using foreknowledge of its band shaping capabilities, the voltage controlled band-pass filter 811 is tuned to pass as much of the desired TV signal while attenuating known undesired signals maximally. If there is no particular undesired signal within the range of the voltage controlled band-pass filter 811, the signal is 'centered' in the voltage controlled band-pass filter 811 pass band.

The TV signals are further processed through the use of a voltage controlled band-reject filter 812 which is coupled to ground and thereby creates a notch filter which enables placing significant attenuation on particular frequencies which are sources of in-band interference. The signal stream with the desired TV signals accentuated while possibly interfering energy is attenuated are passed to an impedance transforming network to best couple them to the input of LNA 830. In one embodiment, the LNA 830 is a component of a computer controlled single-chip TV tuner. The TV signals are filtered and downconverted before being sampled in the ADC 881,882.

Figure 12:
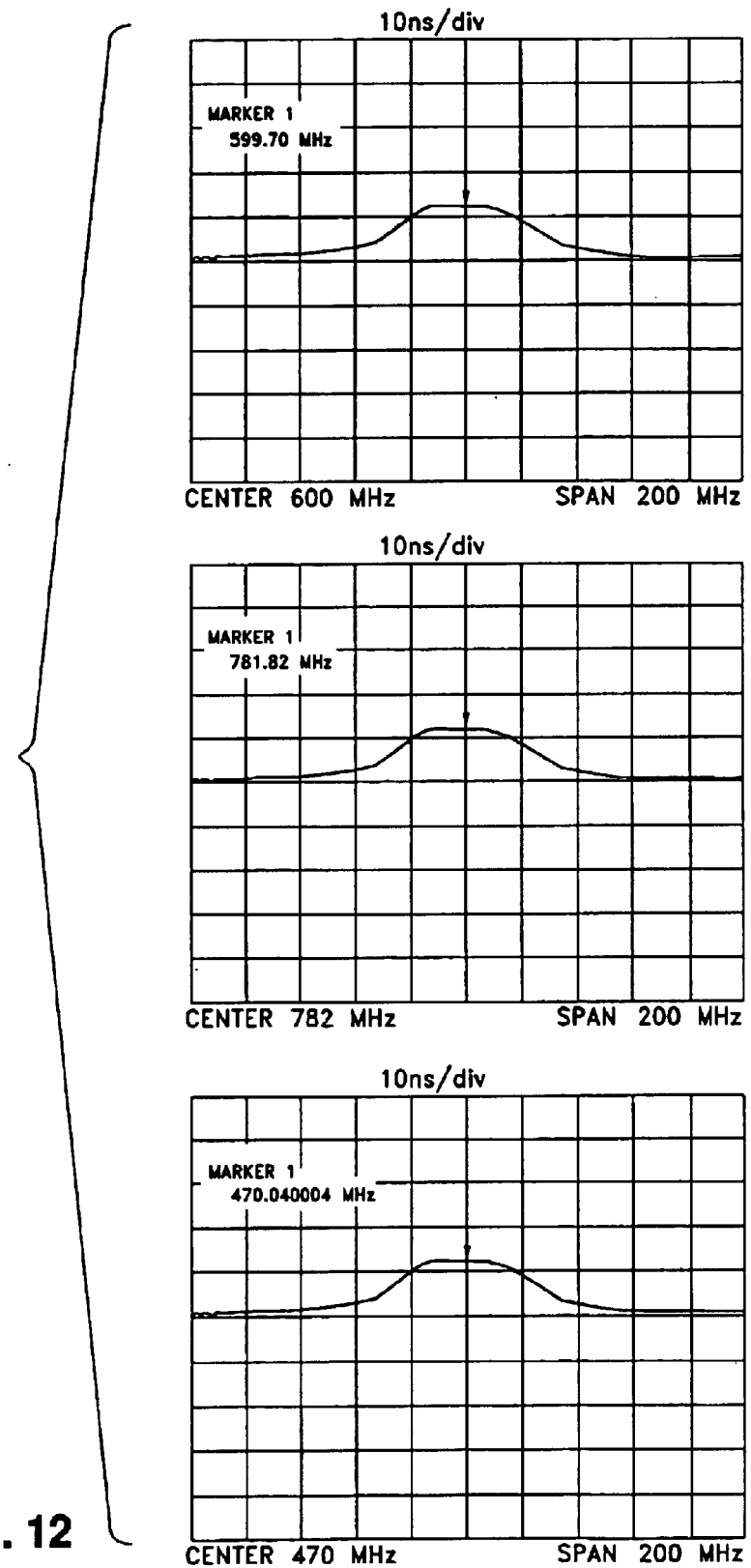
FIG. 12 illustrates the group delay (phase nonlinearity) at various settings of the tunable circuit illustrated in FIG. 10.

In the process of downconversion and filtering, differential group delay is caused on each of the TV channels, which will differ for one TV channel to another and will differ greatly from the group delay on any GPS signals that are used in the position computation. Examples of the causes of group delay for the architecture illustrated in FIG. 8 are shown in FIG. 12. FIG. 12 illustrates the group delay which is caused by the tunable bandpass filter 810 operating at three different tuned frequencies, namely 600 MHz, 782 MHz and 470 MHz corresponding to mid, high and low TV channels in the UHF band. Group delays on the order of 14 nanoseconds occur at the frequency being tuned. Each nanosecond of group delay corresponds spatially to roughly 1 foot of ranging error. Any differential group delay between the TV signals and between TV and GPS signals needs to be actively corrected for. The cumulative group delay on each TV channel must be measured and stored in a database so that it is actively subtracted out from the pseudo range measurement for that TV channel. For example, if the cumulative group delay on a particular channel is measured as 20 nanoseconds, this number is stored in a database (such as a simple lookup table) associated with that TV channel. When the pseudo range for that TV channel is calculated per equation 2d, 3d, 4, that result will then be decreased by 20 nanoseconds (or roughly 20 feet in units of distance).

Figure 13:
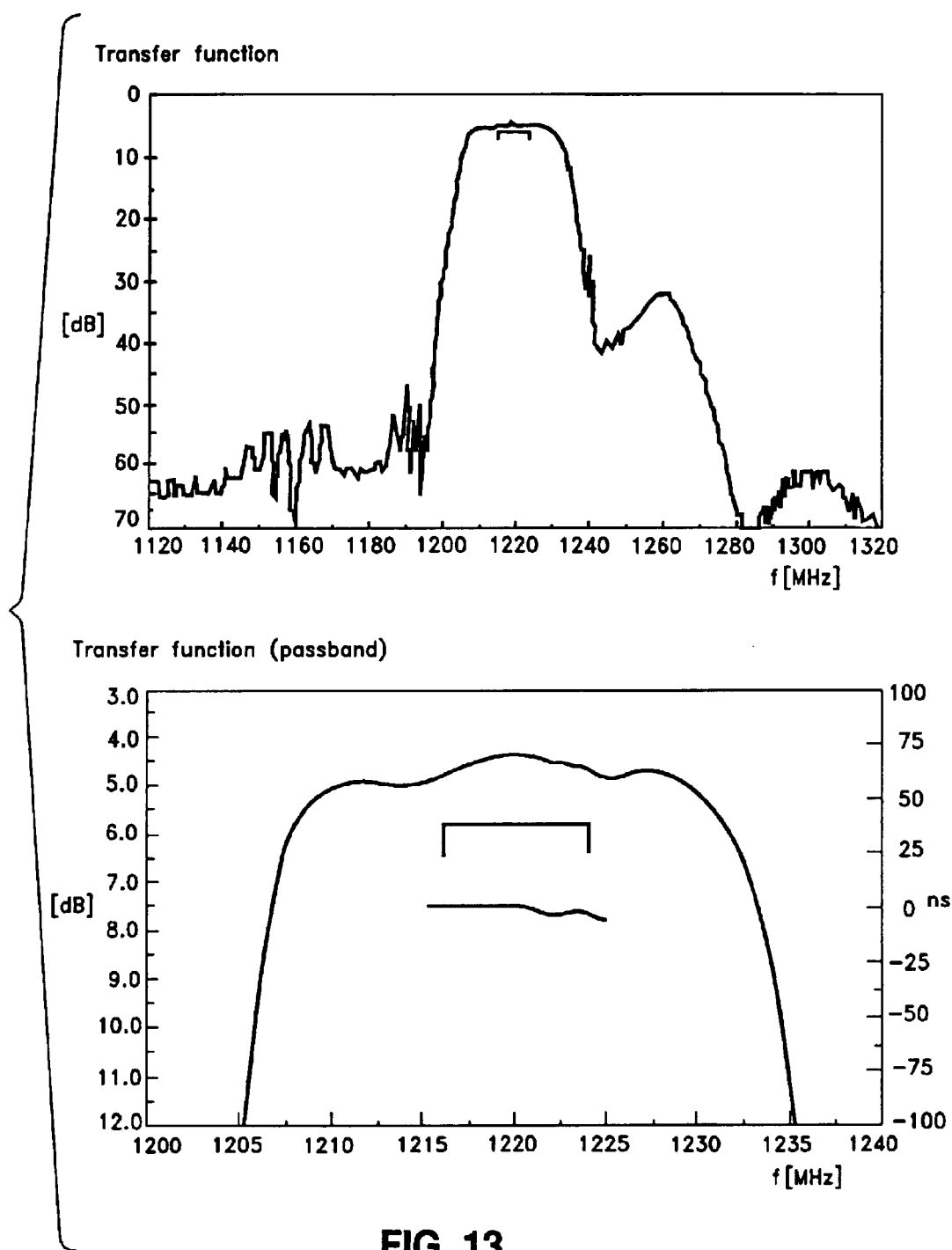
FIG. 13 illustrates the amplitude response of a band-pass SAW filter.

Since group delay is inversely proportional to a filter's passband, most of the group delay on a TV channel arises from the SAW filter 510, which has a very narrow passband. FIG. 13 illustrates the group delay of a typical SAW filter with a passband of 20 MHz, centered on a frequency of 1220 MHz. The group delay is on the order of 75 ns. By using the same SAW filter for both the TV and GPS signals, the same group delay will be caused by the SAW filter on all TV and GPS channels, and can therefore be ignored since it is a common-mode error. This is one of the key advantages of using a single SAW filter 510 for both the GPS and TV signals as illustrated in FIG. 5.

Regarding an antenna which collects the wide frequency range of TV signals, there is a fundamental trade-off between the volume of the antenna and the bandwidth with which the antenna can resonate. Consequently, the design of a small antenna to fit into a mobile wireless device which can capture a wide span of TV frequencies is a technical challenge.

Figure 14:
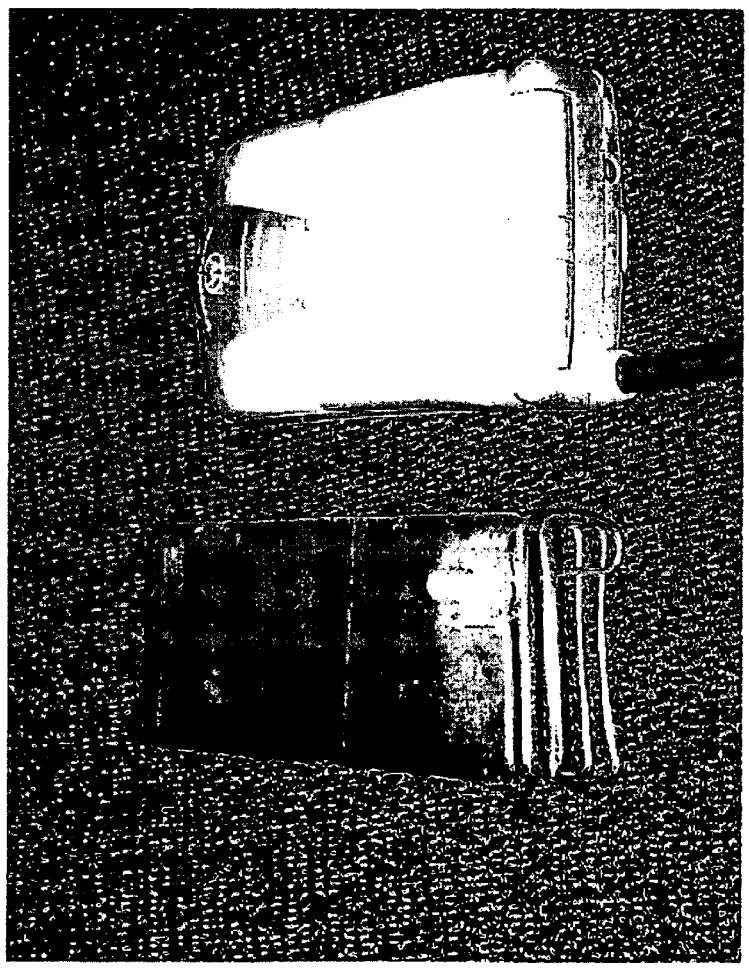
FIG. 14 shows an antenna suitable for a small, low-cost mobile device and which receives television signals over a wide range of UHF frequencies.
Figure 15:
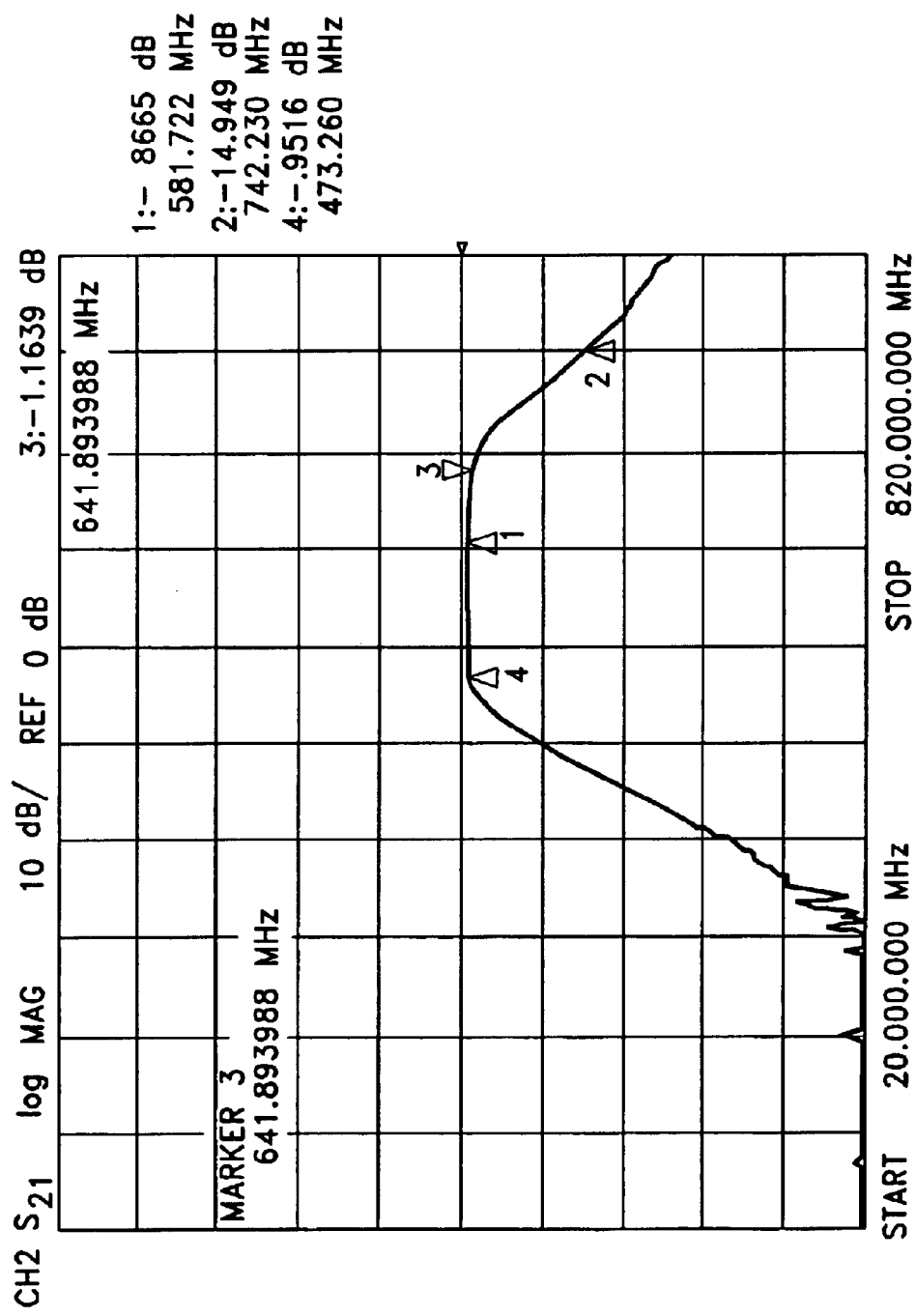
FIG. 15 illustrates the amplitude response of the antenna in FIG. 14, without the use of tuning circuitry.
Figure 16:
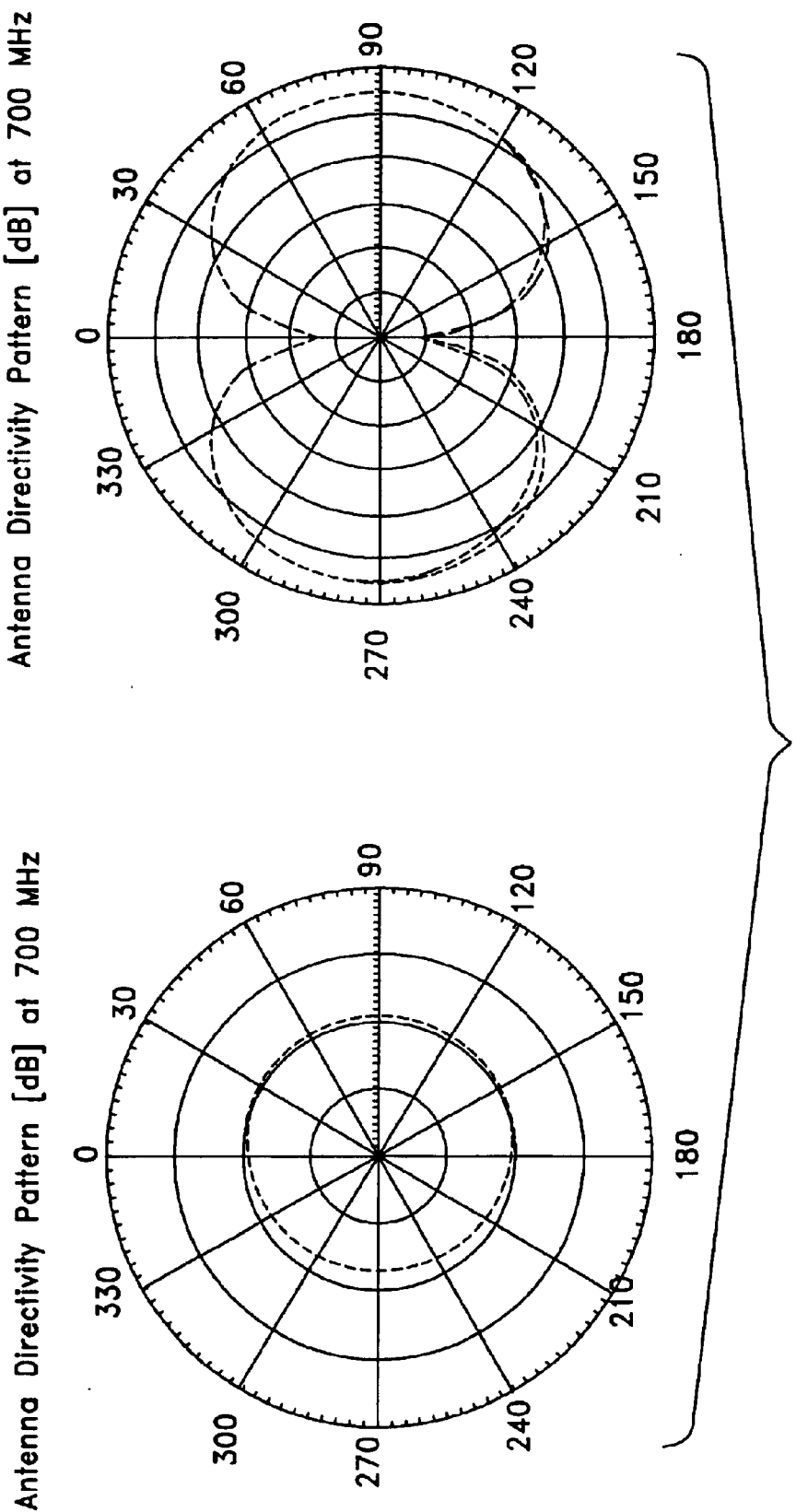
FIG. 16 illustrates the directional gain pattern of the antenna in FIG. 14.

FIG. 14 shows an antenna suitable for a small, low-cost mobile device and which receives television signals over a wide range of UHF frequencies. The antenna is attached to a ground plane for testing, and is laid next to a cellular phone for size comparison. The antenna structure is designed to be lined on the inside of the plastic housing of a wireless device at low cost. The amplitude response of the antenna is illustrated in FIG. 15. The antenna can resonate well over the UHF band from 473 MHz to 741 MHz. FIG. 16 illustrates the gain pattern of the antenna in terms of azimuth and elevation, measured at 700 MHz. The antenna has a fairly uniform gain pattern with respect to azimuth and elevation and is therefore largely insensitive to changes in orientation. Within roughly 30 degrees of the orientation tilt, the antenna has a gain loss of less than 4 dB. This level of reception is sufficient not only for the reception of a TV signal for positioning, but in many cases for the reception of a data signal as well.

Alternate Embodiments

The present invention can be implemented in digital electronic circuitry, or in computer hardware, firmware, software, or in combinations thereof. Apparatus of the present invention can be implemented in a computer program product tangibly embodied in a machine-readable storage device for execution by a programmable processor; and method steps of the present invention can be performed by a programmable processor executing a program of instructions to perform functions of the invention by operating on input data and generating output. The present invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

In contrast with systems that utilize heavily augmented GPS receivers, which must attempt to track an extremely low level GPS signal in urban indoor areas, some implementations of the present invention use the various TV signals to determine position in urban areas and utilize the GPS signals only in more remote areas or in hilly or mountainous regions where the TV signals are almost completely blocked. In those regions, GPS does not generally suffer the severe building attenuation, and serves a very useful function. Thus relatively simple and low cost GPS receivers suffice.

A number of embodiments of the invention have been described. Nevertheless, it will be understood that various modifications may be made without departing from the spirit and scope of the invention.

For example, while various signals and signal processing techniques are discussed herein in analog form, digital implementations will be apparent to one skilled in the relevant art after reading this description.

In some embodiments, location server 110 employs redundant signals available at the system level, such as pseudo-ranges available from the TV transmitters, making additional checks to validate each TV channel and pseudo-range, and to identify TV channels that are erroneous. One such technique is conventional receiver autonomous integrity monitoring (RAIM).

Accordingly, other embodiments are within the scope of the following claims.

What is claimed is:

1. A receiver for processing television signals and GPS signals for position determination comprising:
   an antenna system for receiving a plurality of signals, at least one television signal and at least one GPS signal, wherein the at least one television signal operates at a first frequency and the at least one GPS signal operates at a second frequency;
   a receiver front end coupled to the antenna system for converting the plurality of signals from at least one of the first frequency or of the second frequency to a third frequency; and
   a processing component coupled to the receiver front end for accepting the plurality of signals operating at the third frequency and for converting the plurality of signals into position information of the receiver.

2. The receiver of claim 1 wherein the antenna system comprises a tuning circuit for resonating at different frequencies to accept at least one signal of the plurality of signals.

3. The receiver of claim 1 wherein the antenna system comprises a first feed and a second feed, the first feed for operating at the first frequency and the second feed for operating at the second frequency.

4. The receiver of claim 3 wherein the antenna system further comprises a switching means coupled to the receiver front end for selecting between the first frequency and the second frequency.

5. The receiver of claim 1 wherein the receiver front end comprises:
   a low noise amplifier for amplifying the plurality of signals;

a first frequency converter coupled to the low noise amplifier for performing frequency conversion on at least one signal of the plurality of signals;

a bandpass filter coupled to the first frequency converter for filtering at least one signal of the plurality of signals;

a second frequency converter coupled to the bandpass filter for performing frequency conversion on at least one signal of the plurality of signals; and an analog-to-digital converter coupled to the second frequency converter for digitizing at least one signal of the plurality of signals.

6. The receiver of claim 5 wherein the first frequency converter comprises a first mixer and a frequency synthesizer.

7. The receiver of claim 6 wherein the second frequency converter comprises a second mixer and a local oscillator, the local oscillator being driven by the frequency synthesizer.

8. The receiver of claim 5 wherein the second frequency converter comprises a mixer and a local oscillator coupled to the mixer.

9. The receiver of claim 5 wherein the bandpass filter is a surface acoustic wave filter.

10. The receiver of claim 5 wherein the bandpass filter is a high selectivity bandpass filter.

11. The receiver of claim 5 wherein the plurality of signals comprises:

at least one television signal and at least one GPS signal; and the receiver front end includes a switch coupled to the bandpass filter for switching between the at least one television signal and at least one GPS signal.

12. The receiver of claim 11 wherein the receiver front end further includes a controller for controlling at least one of the switch, the first frequency converter or the low noise amplifier.

13. The receiver of claim 11 wherein the low noise amplifier includes a RF filter to filter the at least one television signal.

14. The receiver of claim 5 wherein the low noise amplifier includes a RF filter to filter at least one signal of the plurality of signals.

15. The receiver of claim 1 wherein the processing component comprises a first downconversion unit, a carrier acquisition unit and a second downconversion unit, the carrier acquisition unit coupled between the first downconversion unit and the second downconversion unit.

16. The receiver of claim 15 wherein the first downconversion unit comprises:

a first downconverter input for accepting the plurality of signals;

a first numerically controlled oscillator having a first pair of quadrature outputs;

at least two mixers for mixing the plurality of signals with the first pair of quadrature outputs to generate a plurality of signals in I and Q form (in phase and quadrature form); and a first downconverter output for outputting the plurality of signals in I and Q form.

17. The receiver of claim 16 wherein the carrier acquisition unit comprises a narrow bandpass filter and a phase locked loop for reproducing a vestigial sideband carrier.

18. The receiver of claim 17 wherein the phase locked loop comprises:

a loop filter;

a second numerically controlled oscillator having a second pair of quadrature outputs; and a phase detector for mixing the second pair of quadrature outputs with the plurality of signals in I and Q form to generate a resulting signal in I & Q form, the resulting signal in I & Q form is passed to the loop filter.

19. The receiver of claim 18 wherein the second downconversion unit comprises a plurality of mixers for mixing the plurality of signals in I and Q form with the resulting signal in I & Q form.

20. The receiver of claim 1 wherein the first frequency is within the UHF and VHF frequency bands.

21. The receiver of claim 1 wherein the second frequency is selected from a frequency group comprising of 1227.6 MHz, 1575.42 MHz or 1.1 GHz.

22. The receiver of claim 1 wherein the third frequency is either an IF frequency or a baseband frequency.

23. The receiver of claim 1 wherein the position information is a pseudo range.

24. The receiver of claim 1 wherein the position information is a user terminal location.

25. A receiver for processing television signals and GPS signals for position determination comprising:

a first antenna for receiving at least one first signal at a first frequency;

a first low noise amplifier for amplifying the at least one first signal;

a second antenna for receiving at least one second signal at a second frequency;

a second low noise amplifier for amplifying the at least one second signal;

a first frequency converter having a first frequency converter input and a first frequency converter output, the first frequency converter input coupled to the first low noise amplifier for performing frequency conversion on the at least one first signal;

a switch having a first switch input, a second switch input and a switch output, the first switch input coupled to the first frequency converter output, the second switch input coupled to the second low noise amplifier, the switch for selecting between the at least one first signal or the at least one second signal;

a bandpass filter coupled to the switch output for filtering the at least one first signal or the at least one second signal;

a second frequency converter coupled to the bandpass filter for converting the at least one first signal or the at least one second signal to a post-frequency converter signal at a third frequency;

an analog-to-digital converter coupled to the second frequency converter for digitizing the post-converter signal and generating a digitized signal; and a processor coupled to the analog-to-digital converter for accepting the digitized signal and for converting the digitized signal into a position information.

26. The receiver of claim 25 wherein the at least one first signal is a television signal.

27. The receiver of claim 25 wherein the first frequency is in the UHF or VHF frequency band.

28. The receiver of claim 25 wherein the at least one second signal is a GPS signal.

29. The receiver of claim 25 wherein the second frequency is selected from a frequency group comprising of 1227.6 MHz, 1575.42 MHz or 1.1 GHz.

30. The receiver of claim 25 wherein the third frequency is either an IF frequency or a baseband frequency.

31. The receiver of claim 25 wherein the first low noise amplifier includes a RF filter.

32. The receiver of claim 25 wherein the first frequency converter comprises a first mixer and a frequency synthesizer.

33. The receiver of claim 32 wherein the second frequency converter comprises a second mixer and a local oscillator, the local oscillator being driven by the frequency synthesizer.

34. The receiver of claim 25 wherein the second frequency converter comprises a mixer and a local oscillator coupled to the mixer.

35. The receiver of claim 25 wherein the bandpass filter is a surface acoustic wave filter.

36. The receiver of claim 25 wherein the bandpass filter is a high selectivity bandpass filter.

37. The receiver of claim 25 wherein the position information is a pseudo range.

38. The receiver of claim 25 wherein the position information is a user terminal location.

39. A receiver for processing television signals and GPS signals for position determination comprising:
- an antenna system for receiving a plurality of signals selected from the group comprising at least one television signal and at least one GPS signal, wherein the at least one television signal operates at a first frequency and the at least one GPS signal operates at a second frequency;
- a low noise amplifier coupled to the antenna system for amplifying the plurality of signals;
- an I/Q downconverter coupled to the low noise amplifier for downconverting the plurality of signals to a third frequency and for generating an I component and a Q component for each of the plurality of signals;
- a first low pass filter coupled to the I/Q downconverter for filtering the I component;
- a second low pass filter coupled to the I/Q downconverter for filtering the Q component;
- a first analog-to-digital converter coupled to the first low pass filter for digitizing the I component and generating a digitized I component;
- a second analog-to-digital converter coupled to the second low pass filter for digitizing the Q component and generating a digitized Q component;
- a processing component having a first processing input and a second processing input, the first processing input coupled to the first analog-to-digital converter for accepting the digitized I component, the second processing input coupled to the second analog-to-digital converter for accepting the digitized Q component.

40. The receiver of claim 39 wherein the processing component converts the digitized I component and the digitized Q component into a position information.

41. The receiver of claim 39 further comprising a tunable bandpass filter having an adjustable passband, the tunable bandpass filter coupled to the antenna system for receiving the plurality of signals.

42. The receiver of claim 41 wherein the tunable bandpass filter comprises at least one filter selected from the group comprising a voltage controlled bandpass filter and a voltage controlled bandreject filter.

43. The receiver of claim 39 further comprising a third low pass filter coupled to the low noise amplifier for filtering the plurality of signals.

44. The receiver of claim 39 further comprising at least one automatic gain control coupled to the I/Q downconverter for adjusting the magnitudes of the I component and the Q component.

45. The receiver of claim 39 wherein the I/Q downconverter comprises
- a first mixer coupled to a local oscillator; and
- a 90 degree phase shifter having a shifter input and a shifter output, the shifter input coupled to the local oscillator and the shifter output coupled to a second mixer.

46. The receiver of claim 45 further comprising:
- a tunable bandpass filter having an adjustable passband, the tunable bandpass filter coupled to the antenna system for receiving the plurality of signals;
- a first low pass filter coupled to the low noise amplifier for filtering the plurality of signals;
- a plurality of low pass filters coupled to the I/Q downconverter for filtering the I component and the Q component; and
- at least one automatic gain control circuit coupled to the I/Q downconverter for adjusting the magnitudes of the I component and the Q component.

47. The receiver of claim 39 further comprising:
- a tunable bandpass filter having an adjustable passband, the tunable bandpass filter coupled to the antenna system for receiving the plurality of signals;
- a first low pass filter coupled to the low noise amplifier for filtering the plurality of signals;
- a plurality of low pass filters coupled to the I/Q downconverter for filtering the I component and the Q component; and
- at least one automatic gain control circuit coupled to the I/Q downconverter for adjusting the magnitudes of the I component and the Q component.

48. The receiver of claim 40 wherein the position information is a pseudo range.

49. The receiver of claim 40 wherein the position information is a user terminal location.

50. A receiver for processing television signals and GPS signals for position determination comprising:
- an antenna system for receiving a plurality of signals selected from the group comprising at least one television signal and at least one GPS signal, wherein the at least one television signal operates at a first frequency and the at least one GPS signal operates at a second frequency;
- a tunable bandpass filter having an adjustable passband, the tunable bandpass filter coupled to the antenna system for receiving the plurality of signals;
- a low noise amplifier coupled to the tunable bandpass filter for amplifying the plurality of signals;
- an I/Q downconverter coupled to the low noise amplifier for downconverting the plurality of signals to a third frequency and for generating an I component and a Q component for each of the plurality of signals, wherein the I/Q downconverter comprises a first mixer coupled to a local oscillator, and a 90 degree phase shifter having a shifter input and a shifter output, the shifter input coupled to the local oscillator and the shifter output coupled to a second mixer;
- a first low pass filter coupled to the I/Q downconverter for filtering the I component;
- a second low pass filter coupled to the I/Q downconverter for filtering the Q component;
- a first analog-to-digital converter coupled to the first low pass filter for digitizing the I component and generating a digitized I component;

a second analog-to-digital converter coupled to the second low pass filter for digitizing the Q component and generating a digitized Q component;

a processing component having a first processing input and a second processing input, the first processing input coupled to the first analog-to-digital converter for accepting the digitized I component, the second processing input coupled to the second analog-to-digital converter for accepting the digitized Q component, wherein the processing component converts the digitized I component and the digitized Q component into a position information.

* * * * *

UNITED STATES PATENT AND TRADEMARK OFFICE
CERTIFICATE OF CORRECTION

PATENT NO.    : 6,917,328 B2
DATED         : July 12, 2005
INVENTOR(S)   : Matthew Rabinowitz It is certified that error appears in the above-identified patent and that said Letters Patent is hereby corrected as shown below:

Column 20,
Line 54, "For $\omega=\omega_{in}-\omega_{offset}$step $\frac{\pi}{2T_t}$" should read -- For $\omega=\omega_{in}-\omega_{offset}$step $\frac{\pi}{2T_t}$ --.

Line 65, "$s_{max}(t)$" should read -- $s_{mix}(t)$ --.
Lines 66-67, "Compute the correlation function $R(\tau)=F^{-1}\{F(S_{code})*F(S_{comb})\}$" should read -- Compute the correlation function --.

Column 21,
Lines 2-5, "$\max_r$" (both occurrences) should read -- $\max_\tau$ --.

Signed and Sealed this

Twentieth Day of September, 2005

JON W. DUDAS
*Director of the United States Patent and Trademark Office*